US011793296B2

(12) United States Patent
Bowyer et al.

(10) Patent No.: US 11,793,296 B2
(45) Date of Patent: Oct. 24, 2023

(54) BEAUTY PRODUCT CREATION PLATFORM

(71) Applicant: Noxell Corporation, Hunt Valley, MD (US)

(72) Inventors: Julian Bowyer, London (GB); Thomas Arthur Salmon, Camberwell (GB)

(73) Assignee: NOXELL CORPORATION, Hunt Valley, MD (US)

( * ) Notice: Subject to any disclaimer, the term of this patent is extended or adjusted under 35 U.S.C. 154(b) by 414 days.

(21) Appl. No.: 16/652,592

(22) PCT Filed: Oct. 9, 2018

(86) PCT No.: PCT/US2018/054984
§ 371 (c)(1),
(2) Date: Mar. 31, 2020

(87) PCT Pub. No.: WO2019/074909
PCT Pub. Date: Apr. 18, 2019

(65) Prior Publication Data
US 2020/0315322 A1    Oct. 8, 2020

Related U.S. Application Data

(60) Provisional application No. 62/679,268, filed on Jun. 1, 2018, provisional application No. 62/569,960, filed on Oct. 9, 2017.

(51) Int. Cl.
*A45D 44/00*        (2006.01)
*G06Q 30/0601*      (2023.01)
(Continued)

(52) U.S. Cl.
CPC ......... *A45D 44/005* (2013.01); *G06F 3/0481* (2013.01); *G06Q 30/0621* (2013.01); *G06Q 50/04* (2013.01); *A45D 2200/25* (2013.01)

(58) Field of Classification Search
CPC ............ A45D 44/005; A45D 2200/25; G06Q 30/0621; G06Q 50/04; G06F 3/0481
See application file for complete search history.

(56) References Cited

U.S. PATENT DOCUMENTS 6,003,012 A    12/1999  Nick
7,712,058 B2    3/2010  Brathwaite et al.
(Continued)

FOREIGN PATENT DOCUMENTS

EP    3085144        10/2016
EP    3240522 A1    11/2017
(Continued)

OTHER PUBLICATIONS

"Customize Your Palette", taken from https://www.maccosmetics.com/customizeyourpalette, published May 13, 2016, pp. 1-11 (Year: 2016).*
(Continued)

*Primary Examiner* — William L Bashore
*Assistant Examiner* — Gregory A Distefano
(74) *Attorney, Agent, or Firm* — SCHWEGMAN LUNDBERG & WOESSNER, P.A.

(57) ABSTRACT

Systems and techniques for a beauty creation platform are discussed herein. A beauty product configuration user interface may be generated. The beauty product configuration user interface includes a first display area and a second display area. A set of selectable product user interface elements may be displayed in the second display area. The beauty product configuration user interface includes a first display area and a second display area. A set of selectable product user interface elements may be displayed in the second display area. A selection may be received of a selectable product user interface element of the set of selectable product user interface elements. In response to
(Continued)

receipt of the selection, a visual representation of a configurable product represented by the selected product user interface element may be displayed in the first display area.

20 Claims, 19 Drawing Sheets

(51) Int. Cl.
*G06Q 50/04* (2012.01)
*G06F 3/0481* (2022.01)

(56) References Cited

U.S. PATENT DOCUMENTS

| | | | |
|---|---|---|---|
| 8,655,737 | B1 | 2/2014 | Tromble |
| 8,788,955 | B2 | 7/2014 | Quine |
| 9,138,041 | B2 | 9/2015 | Samain |
| 9,442,494 | B2 | 9/2016 | Igarashi |
| 9,646,332 | B2 | 5/2017 | Zheng et al. |
| 9,671,795 | B2 | 6/2017 | Igarashi |
| 9,710,829 | B1 | 7/2017 | Sitapara et al. |
| 9,750,976 | B2 | 9/2017 | Weast et al. |
| 2011/0295400 | A1 | 12/2011 | Samain |
| 2012/0260233 | A1 | 10/2012 | Bandyopadhyay et al. |
| 2012/0329033 | A1 | 12/2012 | Giacchetti |
| 2013/0006720 | A1 | 1/2013 | Monoyudis |
| 2013/0041837 | A1* | 2/2013 | Dempski ............ G06Q 30/0201 705/345 |
| 2016/0140627 | A1* | 5/2016 | Moreau ............ G06Q 30/0203 705/7.32 |
| 2016/0171166 | A1 | 6/2016 | Bastien et al. |
| 2016/0183664 | A1 | 6/2016 | Grez |
| 2016/0320728 | A1 | 11/2016 | Giron et al. |
| 2017/0020436 | A1 | 1/2017 | Flament |
| 2017/0027300 | A1 | 2/2017 | Samain et al. |
| 2017/0076348 | A1* | 3/2017 | Jennings ............ G06Q 30/0621 |
| 2017/0116619 | A1* | 4/2017 | Hawkins ............ G06Q 30/0201 |
| 2017/0154372 | A1 | 6/2017 | Balooch et al. |
| 2017/0224090 | A1 | 8/2017 | Lamb et al. |
| 2017/0232676 | A1 | 8/2017 | Jaunet et al. |
| 2017/0273434 | A1 | 9/2017 | Shasteen et al. |
| 2018/0285952 | A1* | 10/2018 | Lu ............................ B01F 29/10 |
| 2019/0012746 | A1* | 1/2019 | Sullivan ................. G06Q 30/02 |
| 2019/0020696 | A1* | 1/2019 | Winawer ............... H04L 51/046 |

FOREIGN PATENT DOCUMENTS

| | | |
|---|---|---|
| WO | WO-2017132349 | 8/2017 |
| WO | WO-2017162713 | 9/2017 |
| WO | WO-2019074909 A1 | 4/2019 |

OTHER PUBLICATIONS

"Custom Palette Builder", Nyx Cosmetics Online, accessed Jan. 9, 2019, URL:https://web.archive.org/web/20161213200906/https://www.nyxcosmetics.com/custom-palette-builder.html?palette_type=eyes&utm_source=website&utm_medium=custom_palette_eyes&utm_campaign=custom_palette_experience, (Dec. 13, 2016), 1 pg.

"Customize Your Freedom Palette", Beautylish Online, accessed Feb. 8, 2019, URL:https://web.archive.org/web/20160721052223/http://www.beautylish.com:80/b/inglot-cosmetics/freedom-system-palette-builder#palette_4_square?, (Jul. 21, 2016), 3 pgs.

"International Application Serial No. PCT/US2018/054984, International Search Report dated Jan. 24, 2019", 4 pgs.

"International Application Serial No. PCT/US2018/054984, Written Opinion dated Jan. 24, 2019", 8 pgs.

Le, Nhu, "Finding Ferdinand x Mik Mak Infommercial", Youtube Video, accessed Feb. 8, 2019, URL: https://www.youtube.com/watch?v=IKfpwQUVjW4, (Apr. 26, 2016), 29 pgs; 28 sec.

"International Application Serial No. PCT/US2018/054984, International Preliminary Report on Patentability dated Apr. 23, 2020", 10 pgs.

* cited by examiner

BEAUTY PRODUCT CREATION PLATFORM

CLAIM OF PRIORITY

This application is a U.S. National Stage Filing under 35 U.S.C. 371 from International Application No. PCT/US2018/054984, filed on Oct. 9, 2018, and published as WO 2019/074909 on Apr. 18, 2019, which patent application claims the benefit of priority to U.S. Provisional Application Ser. No. 62/679,268, filed Jun. 1, 2018, and U.S. Provisional Application Ser. No. 62/569,960, filed Oct. 9, 2017, all of which are incorporated by reference herein in their entirety.

TECHNICAL FIELD

Inventive subject matter disclosed herein relates to a platform for making new beauty products based on input from social media influencers.

BACKGROUND

People may desire customized cosmetic products. Customized cosmetic products may be inefficient to produce if the market is not well defined. Bulk manufacture of customized products may result in excess inventory and wasted resources.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
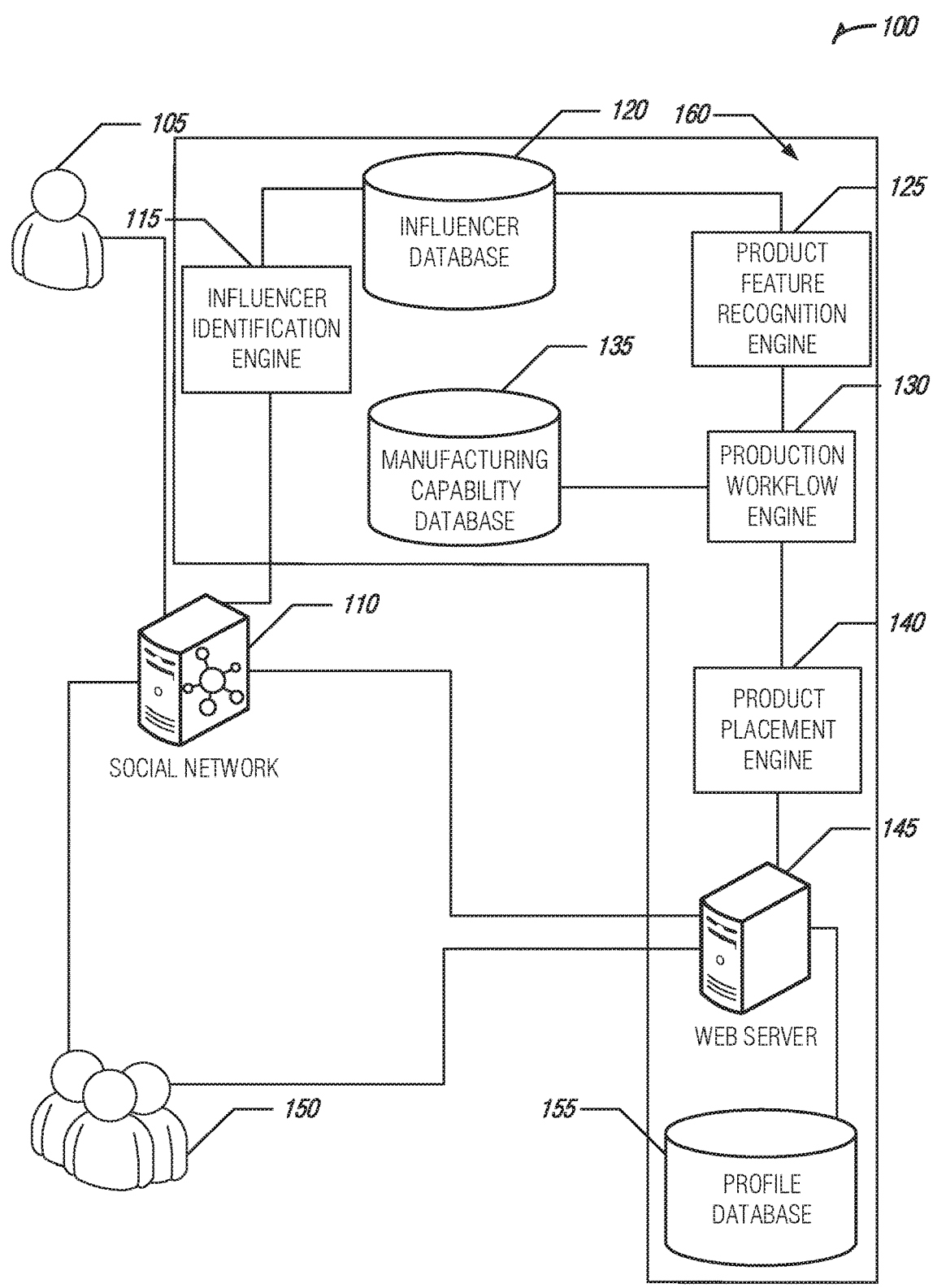
FIG. 1 is a diagram of an example of an environment and system for a beauty product creation platform, according to an embodiment.

Platform embodiments disclosed herein reduce the cost and increase the variety of beauty products by harvesting data obtained from beauty influencers on social media in order to design new products and to quantify the likely number of new products that can be sold. The platform embodiments also include databases of manufacturers of beauty products that are used to match the manufacturer best suited to make a particular new beauty product.

As used herein, the term, "influencer" refers to a person or group that has the ability to influence the behavior or opinions of others. The influencer is the individual whose effect on the purchase decision is in some way significant or authoritative.

As used herein, the term, "audience" refers to others that may be influenced by the influencer. For example, audience members may include those who follow the influencer on social media networks, fans of the influencer, etc.

As used herein, the term, "social media" refers to websites and applicators and other forms of electronic communication that enable users to create and share content or to participate in social networking.

The techniques disclosed herein create a cash flow positive makeup production process by identifying markets and production streams for customized cosmetic products. The techniques may reduce the risk of bringing a wider variety of cosmetics to market.

Influencers may be found and data regarding the influencers may be analyzed to identify individuals with active communities and ideas that may be used to develop new products or enhance existing products.

Identified product ideas may be compared to a database of manufacturers including an indication of the manufacturing capabilities of each factory. An influencer product brief including information about the desired products may be generated and transmitted to factories that formulate and manufacture the product.

A brand may be created for the influencer using social media marketing tools to identify unique qualities of the influencer and interests of the influencer (e.g., issue involvement, aesthetics, etc.). In some example, a design brief may be generated for a crowd based design competition. A winning design may be chosen as the brand for the influencer and the designer may be compensated. In some cases, the brand may be automatically generated form a set of brand templates.

Designs, influencer product mock-ups, and any launch photography or video content may be collected and used to generate a landing page for the product (e.g., a single page website for the purpose of capturing information, etc.). An existing webpage may be modified to include the new product. The website may be monitored to identify any consumers that show interest in the product. Information about the interested customers may be used to create a similar audience and to retargeting the interested customer for similar products or other products that may be of interest to the customer.

The product will be place to reach the audience of the influencer and others. Orders of the product may be monitored to identify when enough product has been ordered to justify manufacture. Additional content may be delivered to the audience and those that have purchased including progress, pictures, and updates.

The techniques may allow anyone with a product idea and an audience to easily launch a new high-quality product at a reduced cost with a reduced time to market.

FIG. 1 is a diagram of an example of an environment 100 and system 160 for a beauty product creation platform, according to an embodiment. The environment 100 may include an influencer 105, a social media network 110, an audience 150, and the system 160. The system 160 may include an influencer identification engine 115, an influencer database 120, product feature recognition engine 125, production workflow engine 130, manufacturing capability database 135, product placement engine 140, web server 145, and profile database 155. The components of the system 160 may be communicatively coupled via a network (e.g., wired network, wireless network, shared bus, etc.).

The influencer 105 may be a user of the social media network 110. The influencer 105 may be a person that may influence online activity of others through their media presence. For example, an influencer may distributed a positive product review through social media channels to channel followers which may influence the channel followers to purchase the product.

The audience 150 may include others that may be influenced by the influencer 105. For example, the audience may include the channel followers receiving the product review distributed through the social media channels. The social media network 110 may be a social computing platform that manages connections between users of the social media network. Users may be connected based on relationship, shared interests, etc. The influencer 1-5 and the audience 150 may be users of the social media network 110. For example, the audience 150 may follow a social media feed of the influencer 105 on the social media network 110.

The influencer identification engine 115 may monitor the social media network 110 to identify the influencer 105. For example, the influencer may be identified based on a number of followers subscribed to channels of the influencer, activity of the audience 150 of the influencer 105, frequency of posts on the social media network 110 by the influencer 105, etc. The influencer identification engine 115 may collect and store information about the influencer 105 in the influencer database 120. Information collected and stored may include demographic information, posts submitted to the social network 110, information about the audience 150 of the influencer, etc.

The product feature recognition engine 125 may identify products or product features based on analysis of information included influencer database 120. The analysis may include parsing posts of the influencer 105 and/or the audience 150 to identify mentions of products and/or product features that may be desired. The analysis may use a variety of natural language processing and machine learning techniques to learn product and product feature preferences from the information about the influencer 105 and the audience 150.

Once a product or product feature is identified by the product feature recognition engine 125, the production workflow engine 130 may determine a manufacturer for the product. The determination may include accessing a manufacturing capability database 135. The manufacturing capability database 135 may include a variety of information about the capabilities of various manufacturers to produce various products in a product line of an entity using the system 160. For example, a manufacturer may be able to manufacture lipstick with a variety of add-in ingredients and in a variety of colors and each available add-in and color may be included in the manufacturing capability database 135. Upon determining that a manufacturer is available (e.g., has the capability, etc.) to produce the product a product-manufacturer record may be created linking the product to the manufacturer that was identified as having production capability.

The product placement engine 140 may determine if a brand identity has been created for the influencer 105. If not, brand creation may be initiated. For example, a design competition may be launched on a website where design ideas, etc. may be submitted for creation of the brand of the influencer 105. Once a brand is created, content relating to the product may be collected (e.g., directly from the social media network 110, from the influencer database 120, etc.) from the channels of the influencer 105 on the social medial network 105. For example, the influencer 105 may post a video of the influencer 105 using the product, etc. which may be collected. The collected content may be used in conjunction with other content created for the product to generate a product page for the product. In an example, the product page may be a webpage served by the webserver 145.

The webserver 145 may access a storage device containing a variety of webpages relating to products, services, etc. of the entity using the system 160. The webserver 145 may be communicatively coupled to a publicly accessible network (e.g., the internet, etc.). The audience 150 may visit the product page to obtain information about the product, place orders for the product, etc. The webserver 145 may also be used by the product placement engine 140 to post content or links to content such as the product page on the social media network 110. The audience 150 may then use the social media network 110 a launch point for gaining information about the product and to make product purchases.

The webserver 145 may include feature to monitor activity of the product pages and the social media network 110 content relating to the product. The monitoring may include identifying that an audience 150 member is interested in the product. The webserver 145 may collect available demographic data for the audience member (e.g., from the social media network 110, by presenting the audience member with a questionnaire, etc.). The demographic information may be aggregated with that from other interested audience 150 members to generate a profile for persons interested in the product. The profile may be stored in the profile database 155. The profile may be used to identify those that may be interested in similar products in the future, to identify additional influencers, make product design decisions, etc.

The monitoring may also include identifying a number of orders placed for the product. In some examples, the product may not be submitted for manufacture until a sales threshold has been reached to reduce the production of products with limited interest. In such a case, once the sales threshold has been reached, the product placement engine 140 may work in conjunction with the production workflow engine 130 to transmit a production order to the manufacturer identified in the product-manufacturer record. The product will then be produced to fulfill the pending orders (and create inventory, etc.).

Figure 2:
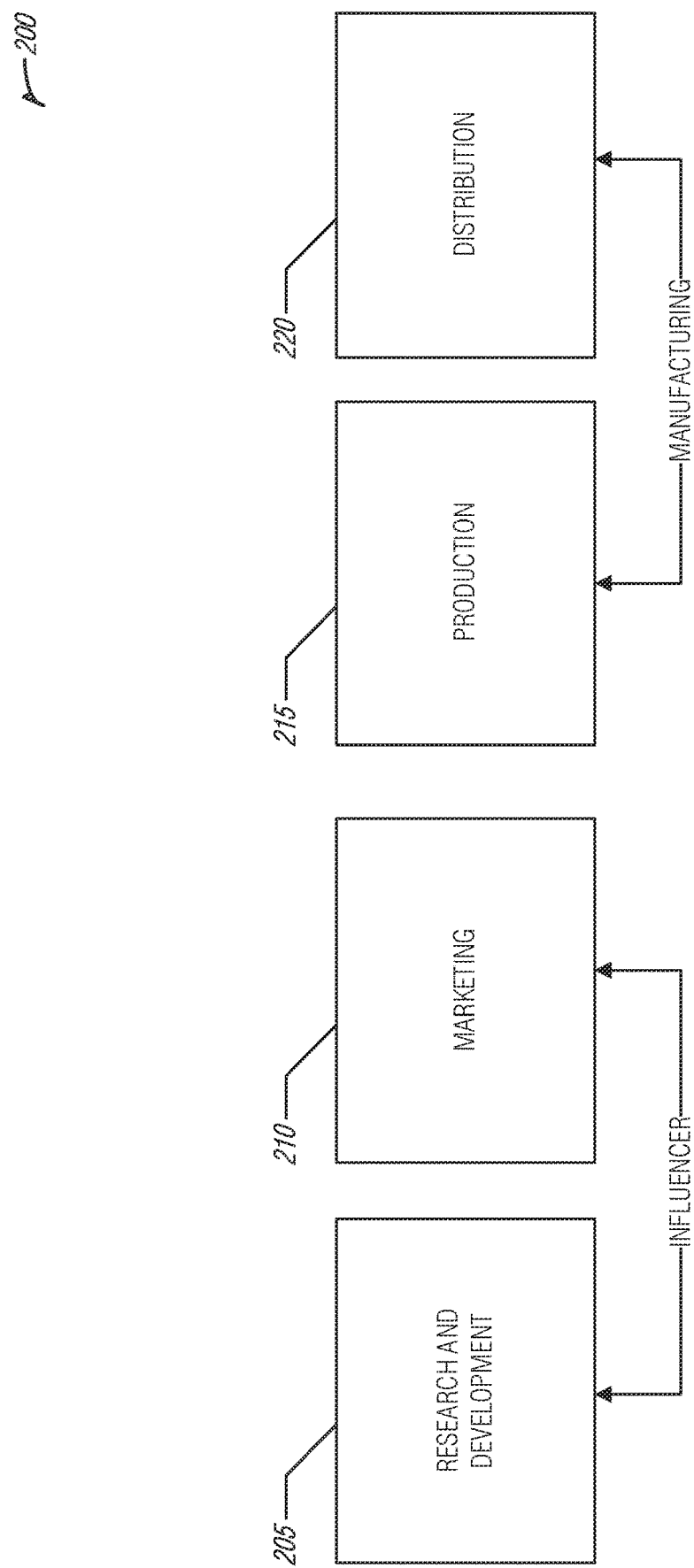
FIG. 2 illustrates an example of task categories for a beauty product creation platform, according to an embodiment.

FIG. 2 illustrates an example of task categories 200 for a beauty product creation platform, according to an embodiment. The task categories 200 may include a research and development (hereinafter R&D) task category 205, a marketing task category 210, a production task category 215, and a distribution task category 220. The R&D task category 205 and marketing task category 210 may be performed by one or more influencer functions of the beauty product creation platform. For example, the R&D task category 205 may be performed in part by the product feature recognition engine 125 as described in FIG. 1 and the marketing task category 210 may be performed in part by the product placement engine 140 as described in FIG. 1. The production task category 215 and distribution task category 220 may be performed by one or more manufacturing functions of the beauty product creation platform. For example, the production task category 215 and the distribution task category 220 may be performed in part by the production workflow engine 130 as described in FIG. 1. Components of the beauty product creation platform may include overlapping function meaning that some components may include functions to perform influencer functions and manufacturing functions.

Influencers may engage with their audiences through their influencer platforms (e.g., social media networks, blogs, etc.) to identify products that their followers would like to buy. In particular, influencers may present information about beauty products to their followers. Followers may provide comments about the products. Comments may be stored in a comments database (e.g., the influencer database 120 as described in FIG. 1, etc.) and may be analyzed to identify information used to make new products (e.g., by the product feature recognition engine 125 as described in FIG. 1, etc.). For some embodiments, the marketing task category 210 may include a cosmetic formulation expert, capable of interacting with the influencer to develop a new cosmetic formulation. In some examples, the formulation may be generated automatically based on the desired feature and formulation models for a product type being customized.

When features of a new beauty product are defined, a branding brief may be formulated for the influencer to identify a name for the new product and describe the product in a manner that will be presented to their followers. The marketing task category 210 may include curating collections of beauty products created by influencers. The marketing task category 210 may also include providing a site for the beauty product brands of the influencer.

New product promotion may be include in the marketing task category 210. Content for the new products of the influencer may posted on their social media channels and, for some embodiments, on a separate website.

Figure 3:
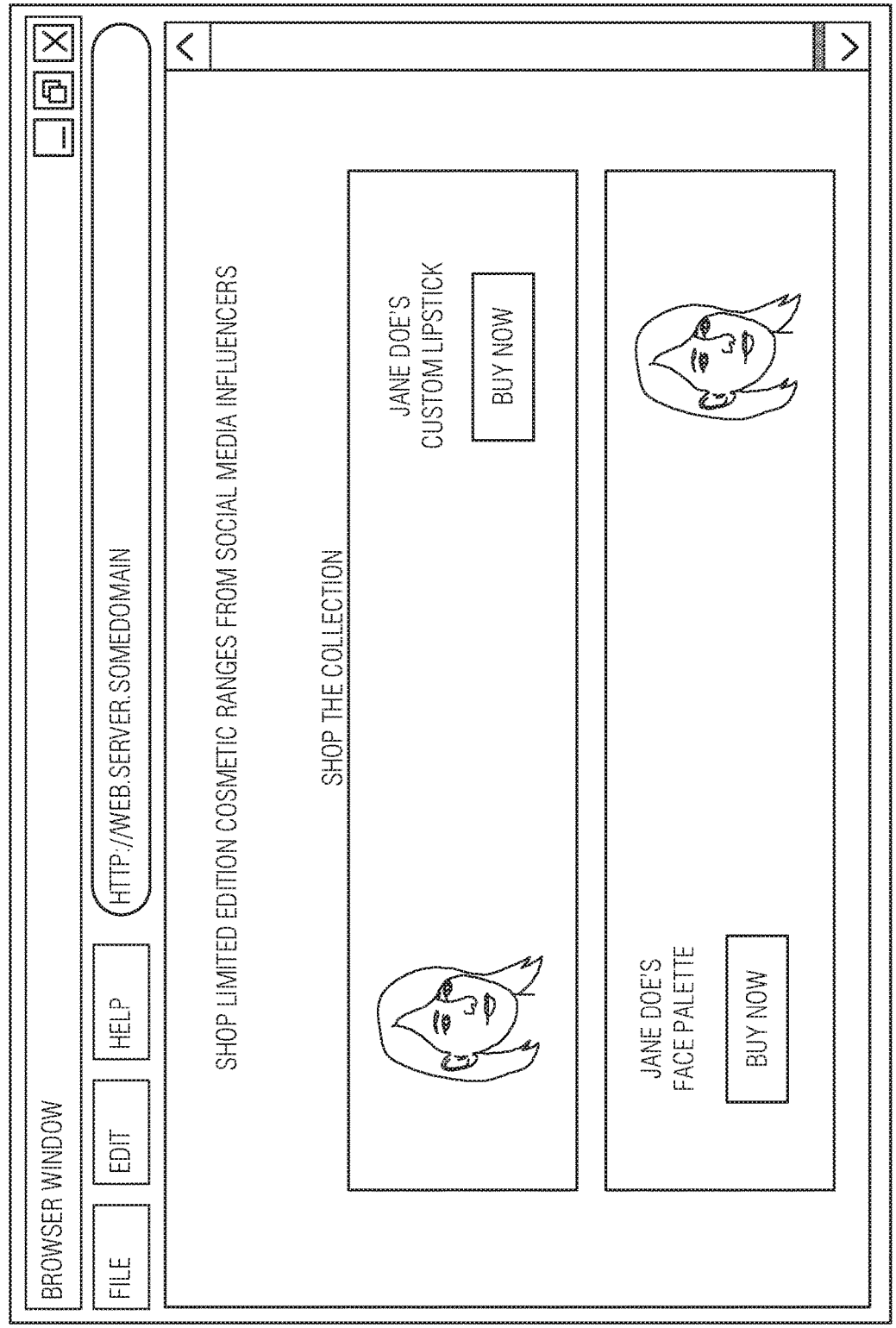
FIG. 3 illustrates an example of a user interface for a beauty product creation platform, according to an embodiment.

FIG. 3 illustrates an example of a user interface 300 for a beauty product creation platform, according to an embodiment. User interface 300 may aggregate new products from multiple beauty product influencers. For one embodiment, small quantities of new influencer products are made for sale on the website, such as shown in user interface 300. The amount of product sold and rate of sale determine whether additional product is made. For another embodiment, new influencer products are pre-sold with the website, such as is shown in user interface 300. The new influencer products are made when a minimum pre-order quantity is reached.

Returning to FIG. 2, the production task category 215 may include maintaining databases of factories and descriptions of what beauty products each factory is qualified to make; quantity of product it can make; cost of products that can be made and quality data of products made by the factory. The databases also include contact information for each factory.

The distribution task category 220 may include task to enable new beauty products to be sold through the website, such as is shown in user interface 300 of FIG. 3, and distributed through a fulfillment service.

Figure 4:
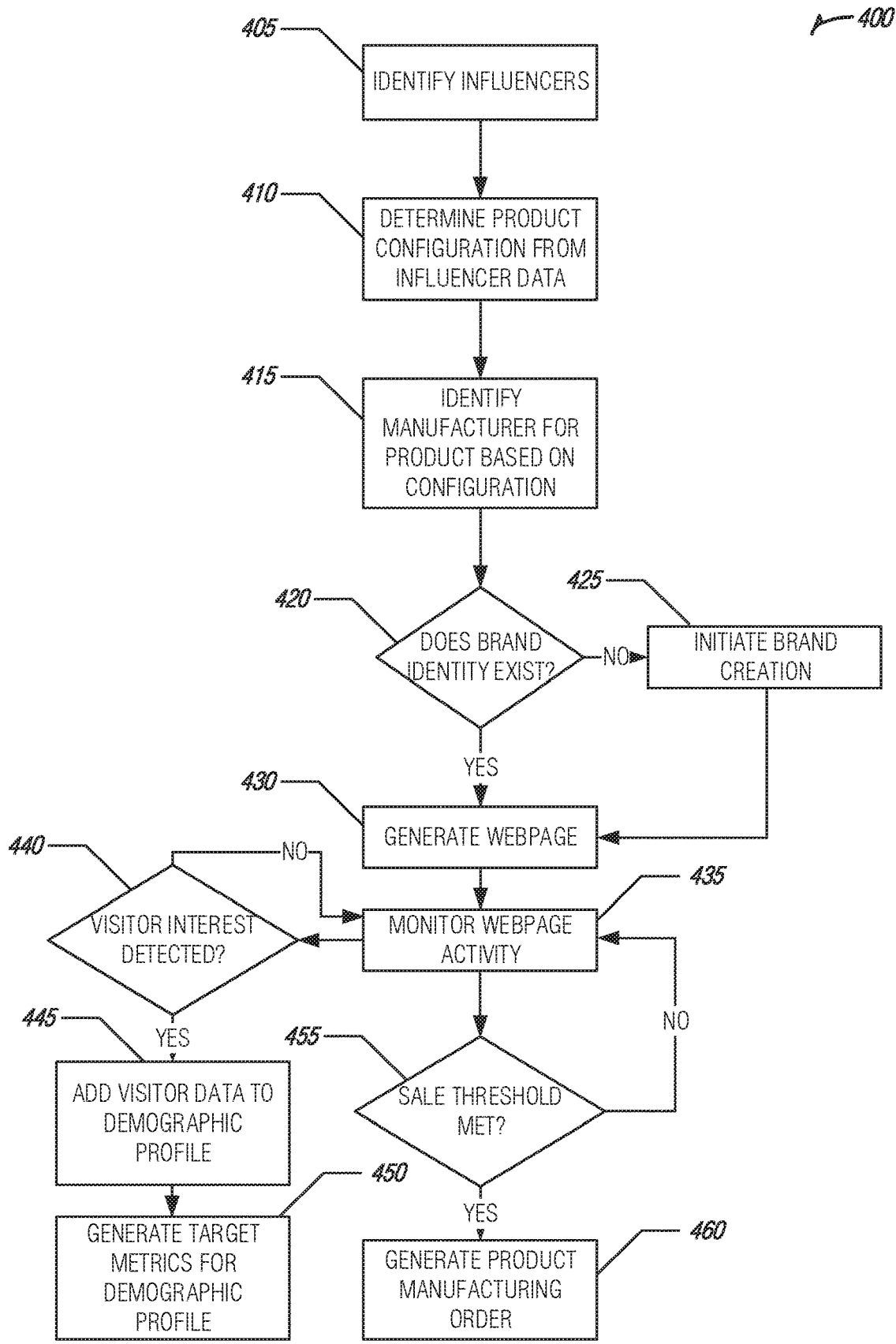
FIG. 4 illustrates an example of a process for beauty product creation platform, according to an embodiment.

FIG. 4 illustrates an example of a process 400 for beauty product creation platform, according to an embodiment. The process 400 may provide features as described in FIGS. 1-3.

Influencers may be identified (e.g., at operation 405). For example, the influencers may be identified on a social media network based on a number of connections, frequency of posts, content of posts, etc. Data of the influencer and the audience of the influencer may be collected and analyzed.

The analysis of the data may determine a product configuration desired by the audience (e.g., at operation 410). For example, several comments from the audience may include mention of lipstick with a particular ingredient.

A database containing manufacturing capabilities of a variety of manufacturers may be referenced to determine a manufacturer capable of manufacturing the product (e.g., at operation 415). For example, it may have been identified that the audience desires lipstick with aloe included as an ingredient and the database may be search to determine a manufacture that may be capable of manufacturing a lipstick with aloe as an ingredient.

An influencer may have one or more brands of customized items. If this is the first product created for the influencer, the influencer may not have a brand identity created. It may be determined whether a brand identity exists (e.g., at decision 420). If not, brand creation is initiated (e.g., at operation 425). For example, an online brand creation competition campaign may be launched to initiate creation of the brand. Once the band is created (or it is determined that one exists), a webpage may be generated for the product (e.g., at operation 430). A webpage may be generated for each influencer product and the product webpages may be aggregated on an influencer webpage (e.g., as shown in FIG. 3, etc.).

The webpage may be monitored to identify activity such as visitor product interest and order submissions (e.g., at operation 435). If a visitor interest is detected (e.g., at decision 440), data about the visitor such as demographic data may be added to a demographic profile for the product (e.g., at operation 445). The interest may be based on a variety of detected visitor activities such as, for example, length of visit, clicks, etc. Target metrics may be generated for the demographic profile that may be used in marketing similar products, etc. (e.g., at operation 450).

The webpage activity may be monitored to determine if a sale threshold has been met (e.g., at decision 455). For example, a product may have a pre-sale target indicating a quantity of the product to be pre-sold before the product is manufactured. If the threshold has been met, a product manufacturing order may be generated and transmitted to the manufacturer (e.g., at operation 460). For example, a threshold quantity of aloe containing lipstick units may have been purchased and an order for manufacture of the aloe containing lipstick may be generated and transmitted to ACME cosmetics company that was previously identified as being capable of producing the product (e.g., at operation 415).

Cosmetic product design may be a lengthy process that, as the result of several design iterations, may result in a new product to be released for sale to the public. The designer may work with a variety of formularies and packaging designers to attempt to capture the desired product attributes desired by the customer. However, the increased prevalence of social media by the cosmetic buying public may lead to rapid shifts in product tastes and product demands. Traditional techniques for customized product design may be slow to respond to rapidly changing trends leading to increased costs from unsold product and loss of customers to other cosmetic manufacturers.

The techniques and systems described herein address the problems with rapid product design to address rapidly changing trends by providing a platform that allows influencers (e.g., celebrities, social media personalities, etc.) to create a custom product portfolio of specifically configured products. By reducing the iterations in the design process and presenting a series of user friendly interfaces to the influencer, products may be designed rapidly that target specific groups of consumers. In addition to reducing time to market, the influencers are provided with the tools needed to respond to changing trends resulting in reduced product waste. For example, a social media personality may produce a limited run of a face makeup palette for spring for her twitter followers knowing that by summer a new product will need to be configured due to an upcoming event that may change the preferences of the twitter followers.

The user may use the interfaces to create a fully customizable makeup palette. Rather than just filling the palette pans, the user may design and create unique packaging designed from scratch. The user may name shades, choose colors and set the tone. The user may create a portfolio of customized products to create their own makeup brand. The product configuration system allows the user to select a variety of cosmetic products such as, for example, eye shadows, highlighter, bronzer, blusher, eyebrow powder, etc. to include in a package designed by the user. The user interfaces assist the user in selecting a palette size, selecting products, designing the packaging including logos, images, text, etc. and selecting a palette finish. Additionally, or alternatively, the user may begin the product design using a professionally created package template, The user may then share and sell the customized products in their portfolio by distributing product information via application programmer interfaces (APIs) that establish an interconnection between the product configuration system and online content providers (e.g., social media platforms, websites, blogs, etc.). Purchasers may then be brought back to the product configuration platform to purchase the customized products.

The user may be presented with a user interface for establishing a website for listing and selling the portfolio of customized products. The interface may allow the user to create a custom online shop that reflects the image of the user. The interface may allow the user to upload images and edit text of the shopping site so that the site appeals to the potential customers of the user. The user may be able to create a custom domain and uniform resource locator (URL) for the site to make it easier for customers to visit the site and further the appearance of the site being that of the user. The beauty products creation platform may host a plurality of user sites that are each customized by (or for) the users. Each site is a sub-site of the beauty products creation platform allowing centralized administration, security, and point-of-sale processing.

The site may list each of the products in the product portfolio of the user along with images and descriptions. A customer may visit the site and add selected products to a virtual shopping bag. When the customer is finished selecting products, the customer is directed through a checkout process and a purchase of the products is completed. The order is then submitted for fulfillment. In an example, the user may create products that are limited-edition or available to a certain segment of the customer community. The site may include a login function that allows the customer to create a customer profile. The profile may include demographic information, preferences, purchase history, etc. The limited-edition products may only be visible on the site to customers that login and have profile attributes matching attribute requirements designated for the limited-edition product. Thus, the product listing may be customized for customers or groups of customers.

The site may also include a variety of filtering mechanisms that allow customers to modify the display of products to show those meeting certain criteria such as, for example, color, rating, application, etc. The site may also use the customer profile information to filter or sort product listings based on customer attributes. This may allow a more customized product browsing experience for the customer which may lead to return visits and purchases through the site.

Figure 5:
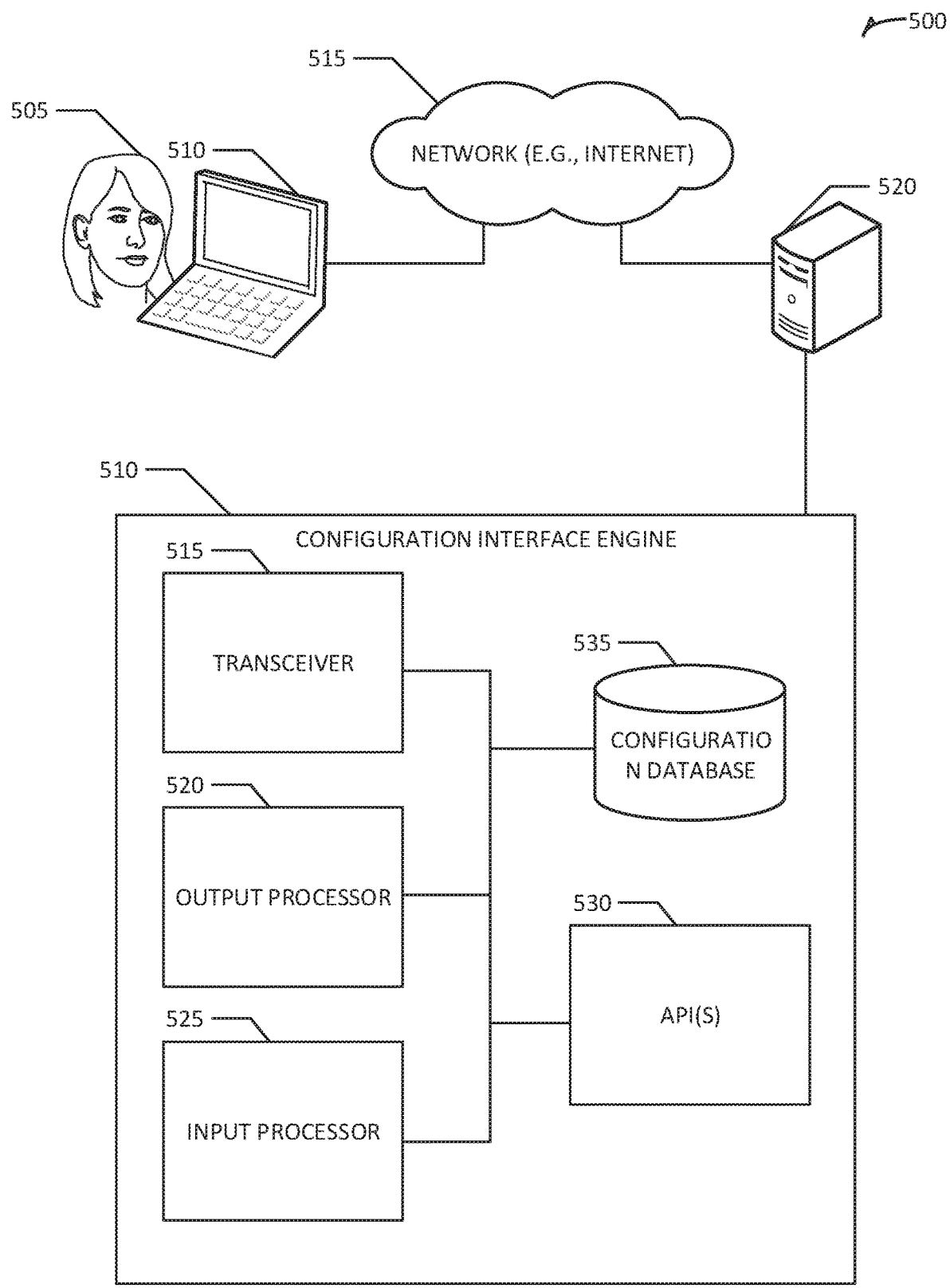
FIG. 5 is a block diagram of an example of an environment and a system for an influencer product customization engine, according to an embodiment.

FIG. 5 is a block diagram of an example of an environment 500 and a system 510 for an influencer product customization engine, according to an embodiment. The environment 500 may include a user 505 interacting with a computing device 500 that is communicating via a network (e.g., internet, wireless network, cellular network, etc.) 515 with a server (e.g., web server, application server, cloud service platform, etc.) 520. The server 520 may be communicatively coupled (e.g., via a wired network, wireless network, shared bus, etc.) to the system 510. In an example, the system 510 may be a configuration interface engine. The system 510 may include a variety of components including a transceiver 515, an output processor 520, an input processor 525, application programming interfaces (APIs) 130, and a configuration database 535.

The user 505 may be a person that has influence over cosmetic purchasers or has a desire to establish a customized cosmetic line of products. The server 520 may be hosting a beauty products creation platform that facilitates the creation and formulation of custom beauty products including automated product sourcing, brand creation, automated product configuration, etc. The server 520 may host the system 510 to provide user interface access to the beauty products creation platform for the user 505. For example, the user 505 may desire to create a custom beauty product and the system 510 may provide a dynamic user interface the allows the user 505 to efficiently configure a product that may be placed into an automated production stream by the beauty products creation platform. Thus, the user interface reduces the complexity of product configuration and reduces the time that users interact with the server 520 resulting in reduced network and processor utilization.

The transceiver 515 may control data ingress and egress for the system 510. For example, when a request for a user interface is submitted to the system 510, the transceiver 520 may receive the request and forward the request to the input processor 525. The input processor 525 may determine that a user interface output has been requested and the input processor 525 may transmit the request to the output processor 520 to display the requested outputs. For example, the user 505 may drag select an interactive user interface element such as, for example, a sub-product selection, which may be received as an input by the input processor 525. The input processor 525 may transmit data regarding the input (e.g., information about the product selected, etc.) to the output processor 520. The output processor 520 may generate and/or modify a display of a user interface element (e.g., a display of a product configuration template, etc.) to include a display of the selected sub-product.

In an example, the APIs 530 may be used to obtain data that may be used in product configuration. For example, an interface for connecting to a social media account may be included in the APIs 530. The interface may be used to obtain content from the social media content of the user 505 for inclusion in a product packaging design. For example, the user 505 may connect to a social media account to obtain pictures, posts, etc. from the social media network and may use a user interface window generated by the output processor 520 to specify placement of the content on the packaging of the product. For example, a post discussing a problem being addressed by the product may be placed on the bottom of the product by the user 505 using the user interface.

When the user 505 has completed configuration of the product using the provided user interfaces, the product configuration may be placed in the configuration database 535. The configuration database 535 may be used by an automated production workflow of the beauty products creation platform in manufacturing the product. The configuration database 535 may include identifying information that may be accessed in generating user interfaces for displaying a portfolio the products of the user 505 that are available for purchase. The configuration database 535 (or other databases) may be include data for available product configuration options. The options may be used by the output processor 520 in generating user interfaces for product configuration. For example, a sub-product selection user interface may include a set of interactive user interface elements for sub-products that are compatible (e.g., as determined by evaluation of data included in the configuration database 535, etc.) with a selected product to be configured.

Figure 6:
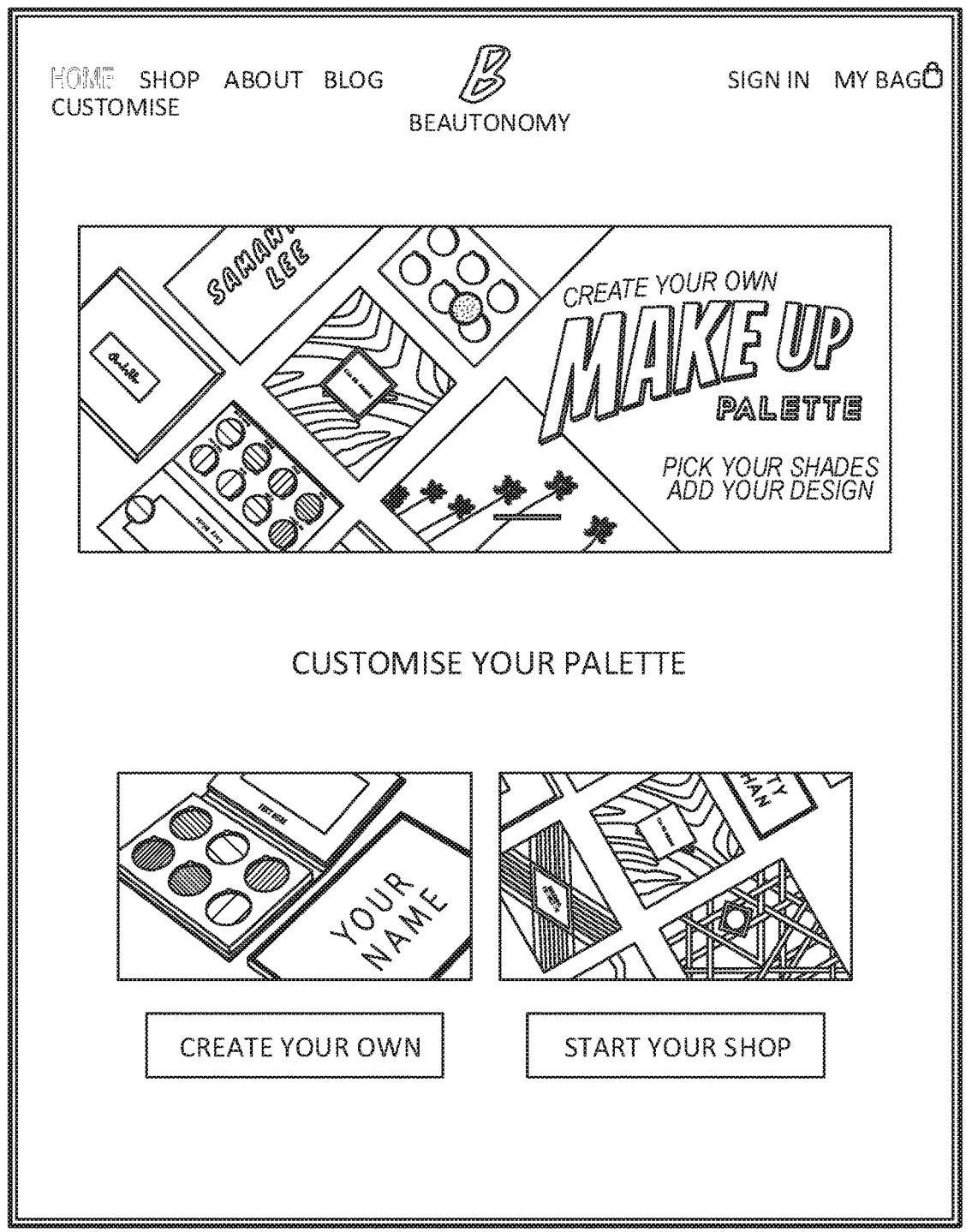
FIG. 6 illustrates an example of a customization user interface for an influencer product customization engine, according to an embodiment.

FIG. 6 illustrates an example of a customization user interface 600 for an influencer product customization engine, according to an embodiment. A user may launch the customization user interface 600 (e.g., by launching an application, visiting a website, etc.). The customization user interface 600 may include a variety of navigational user interface elements that, when selected, take the user to other user interfaces such as, for example, a shopping user interface, a blog user interface, an about user interface, a sign in user interface, shopping bag user interface, etc. Selectable user interface elements may be provided guiding the user to a user interface for creating a custom product which may guide the user through a series of user interfaces for selecting and customizing a product.

Figure 7:
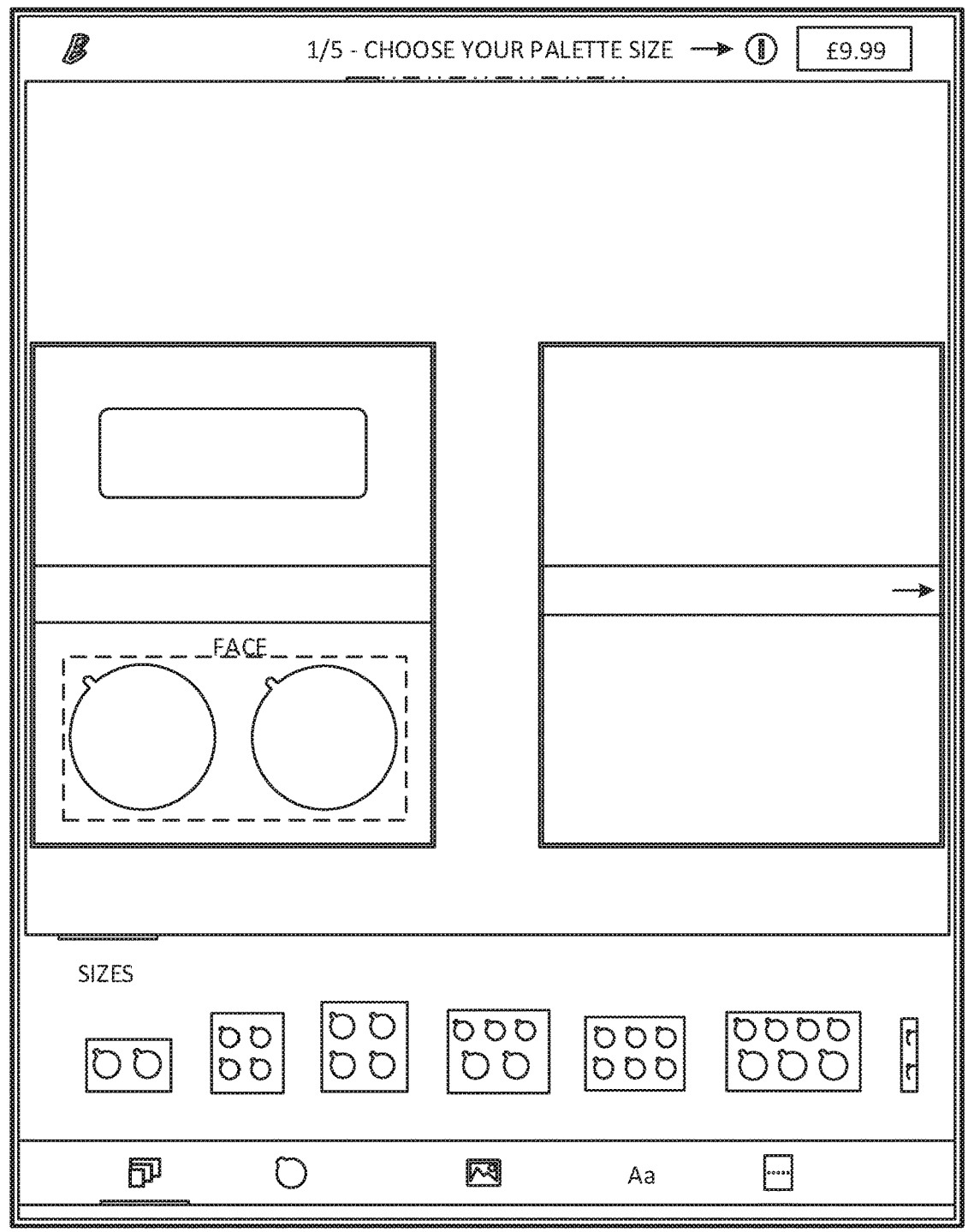
FIG. 7 illustrates an example of a palette size selector user interface for an influencer product customization engine, according to an embodiment.

FIG. 7 illustrates an example of a palette size selector user interface 700 for an influencer product customization engine, according to an embodiment. The pallet size selector user interface 700 may present the user with a variety of products (e.g., makeup palettes, etc.) that may be customized. The products may be displayed as selectable thumbnail images that when selected update a display region of the user interface to display an image of the product including customization areas of the product.

Figure 8:
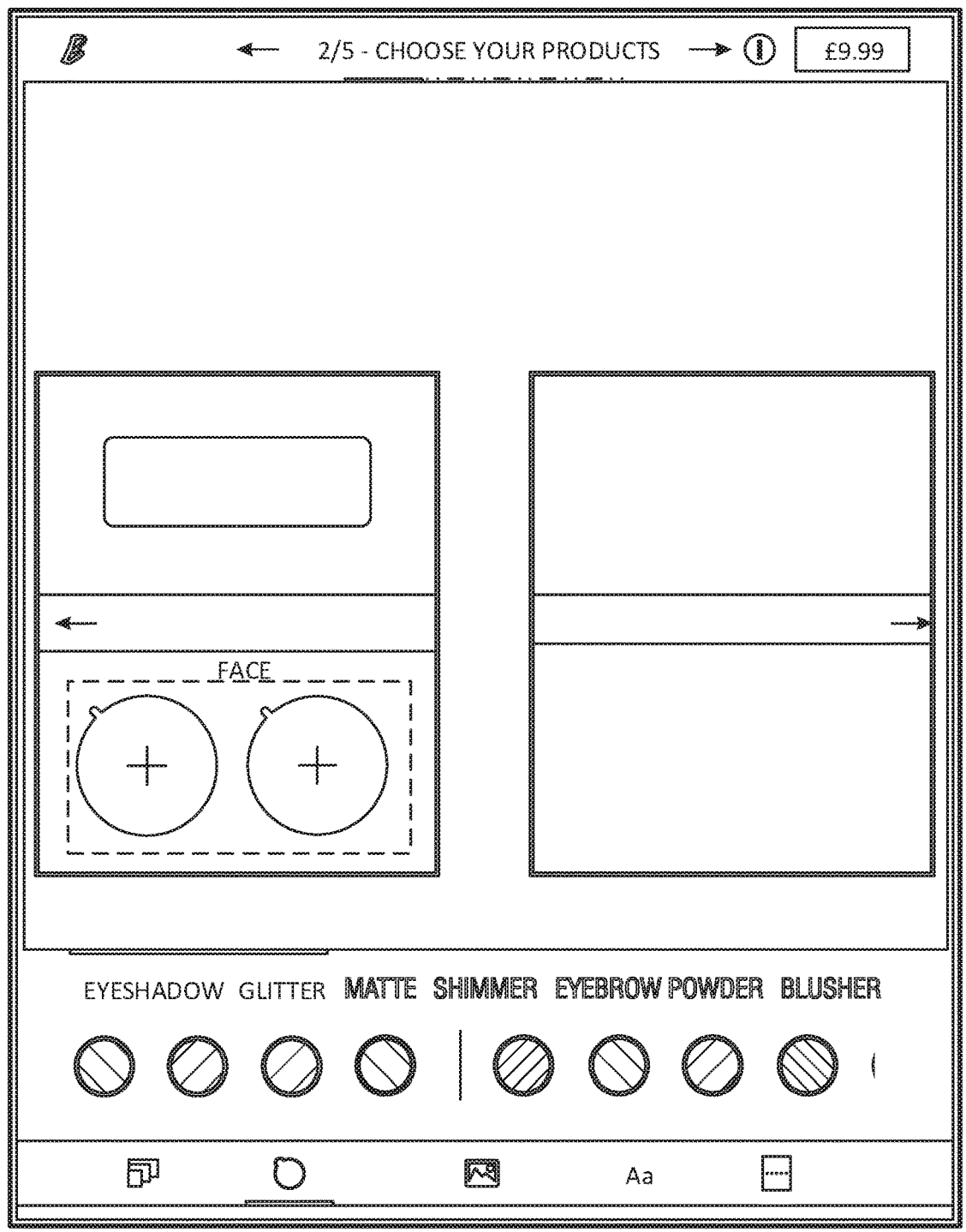
FIG. 8 illustrates an example of a product selection user interface for an influencer product customization engine, according to an embodiment.
Figure 9:
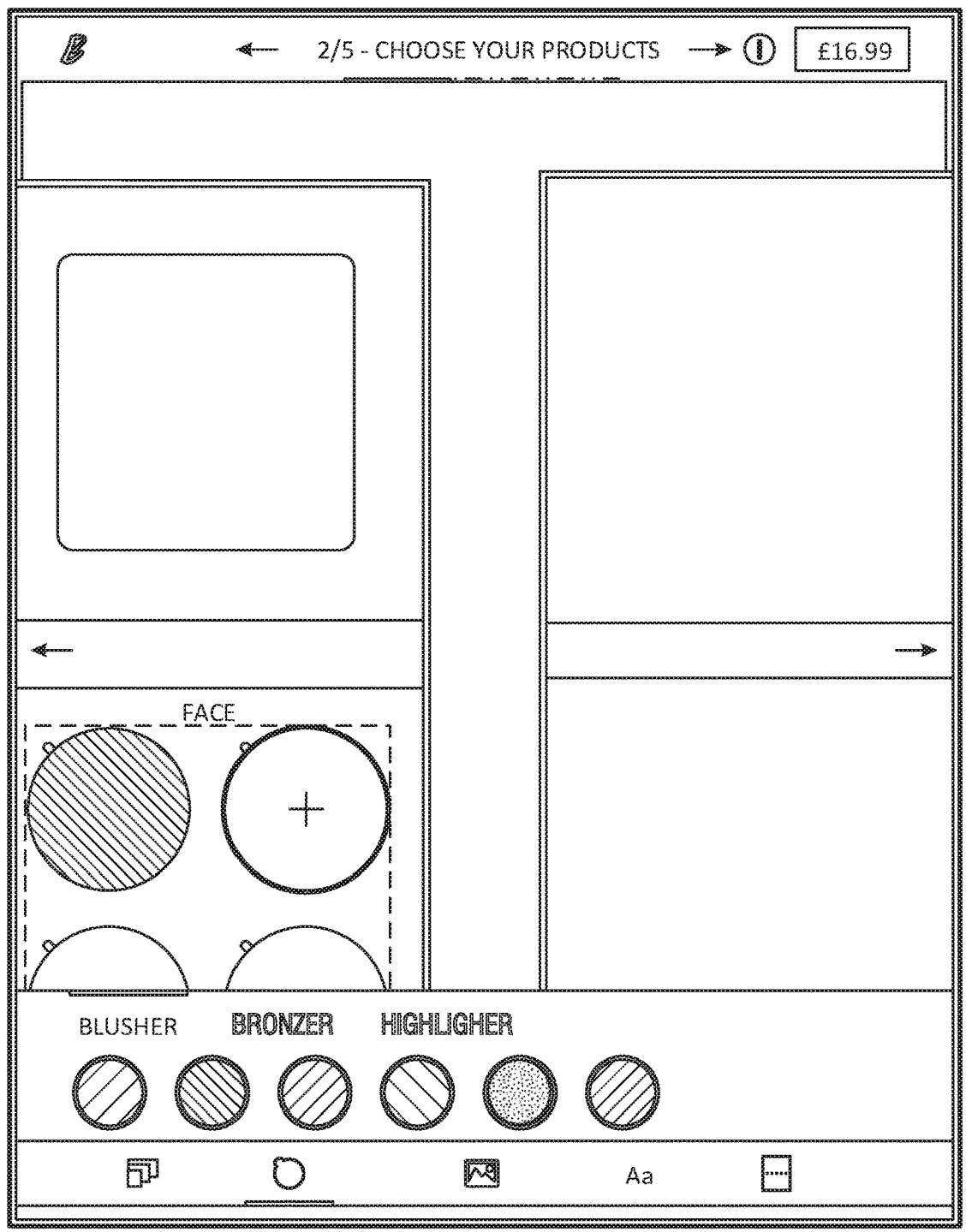
FIG. 9 illustrates an example of a product selection user interface with products selected for an influencer product customization engine, according to an embodiment.
Figure 10:
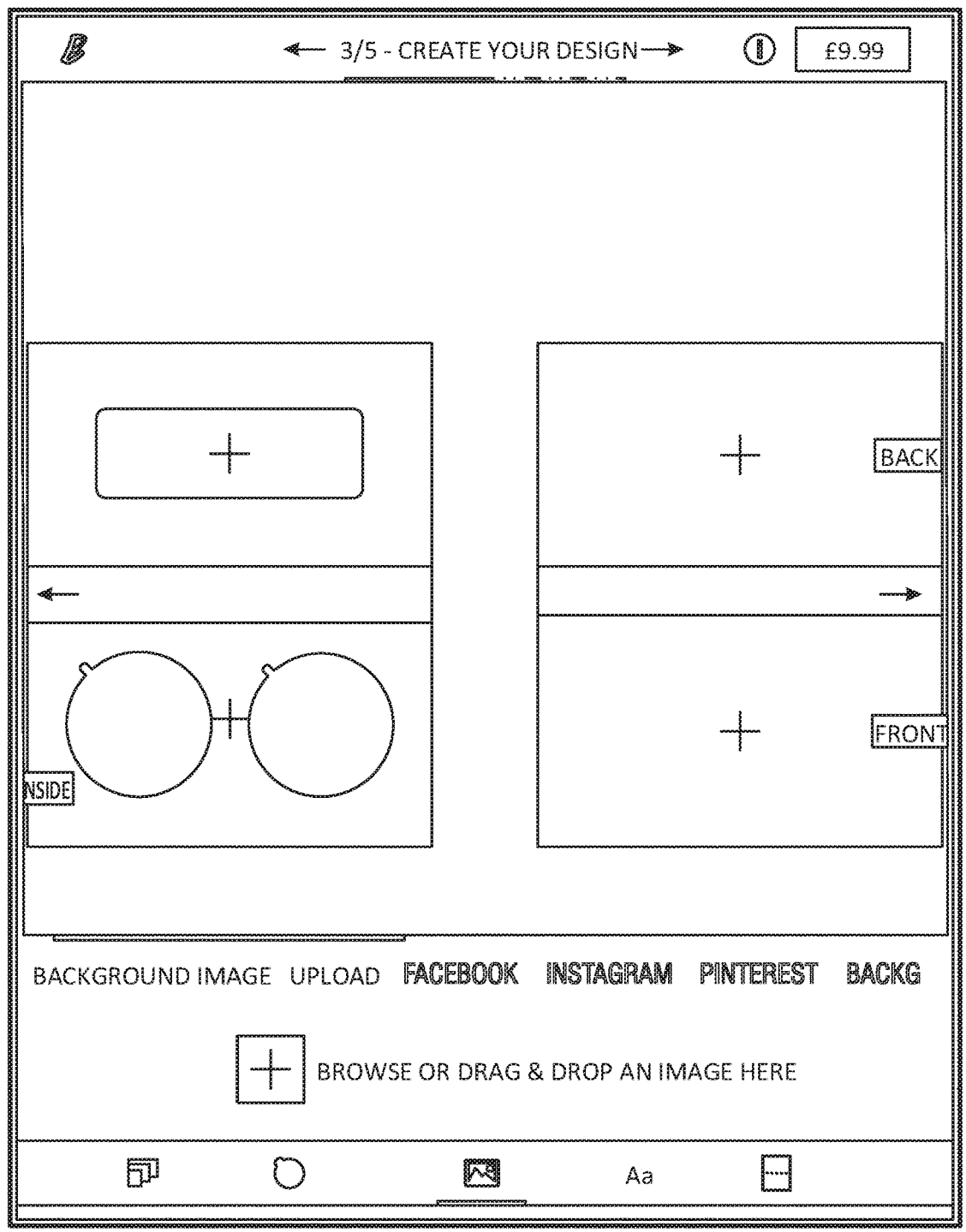
FIG. 10 illustrates an example of an image design selection user interface for an influencer product customization engine, according to an embodiment.
Figure 11:
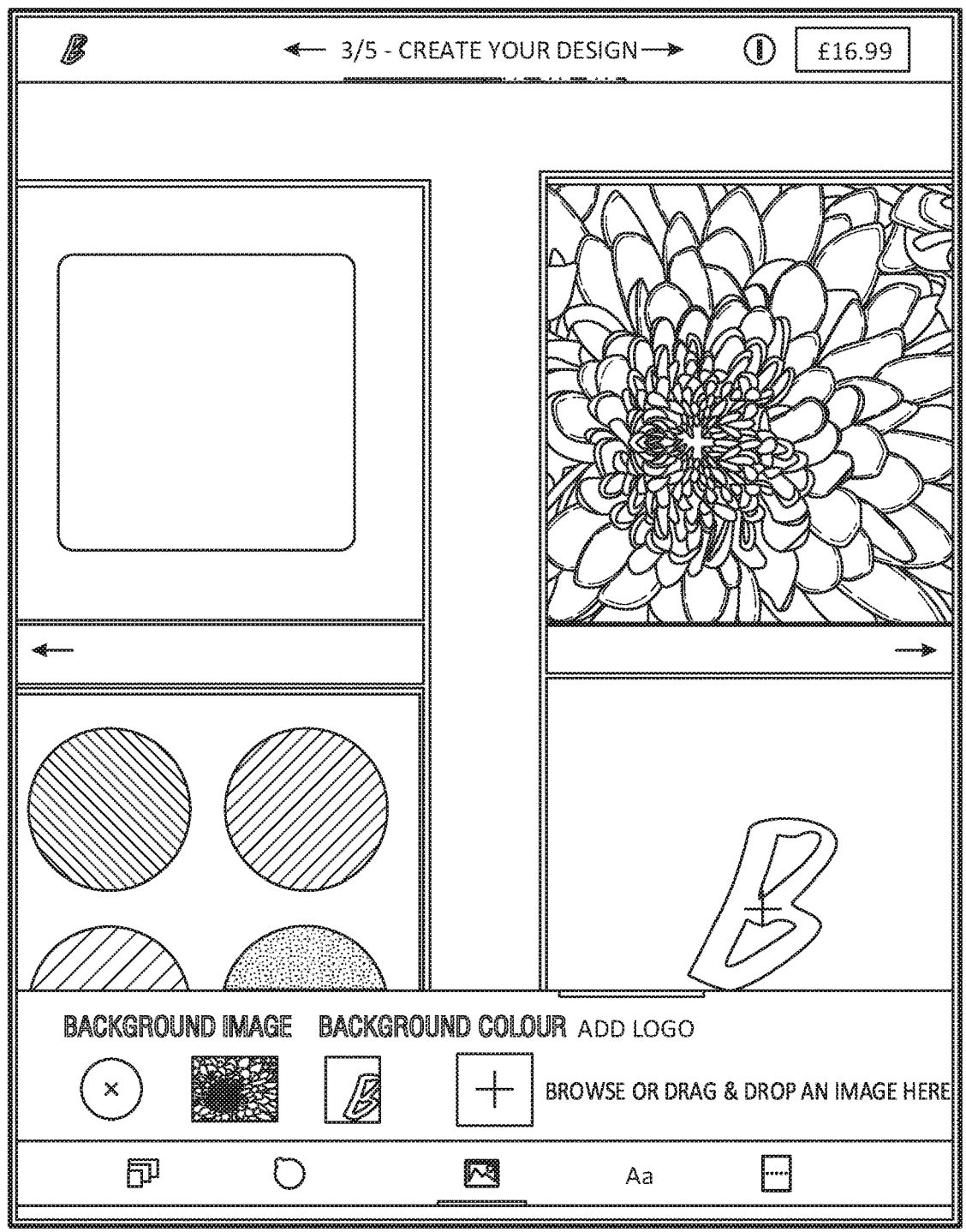
FIG. 11 illustrates an example of an image design selection user interface with selections made for an influencer product customization engine, according to an embodiment.
Figure 12:
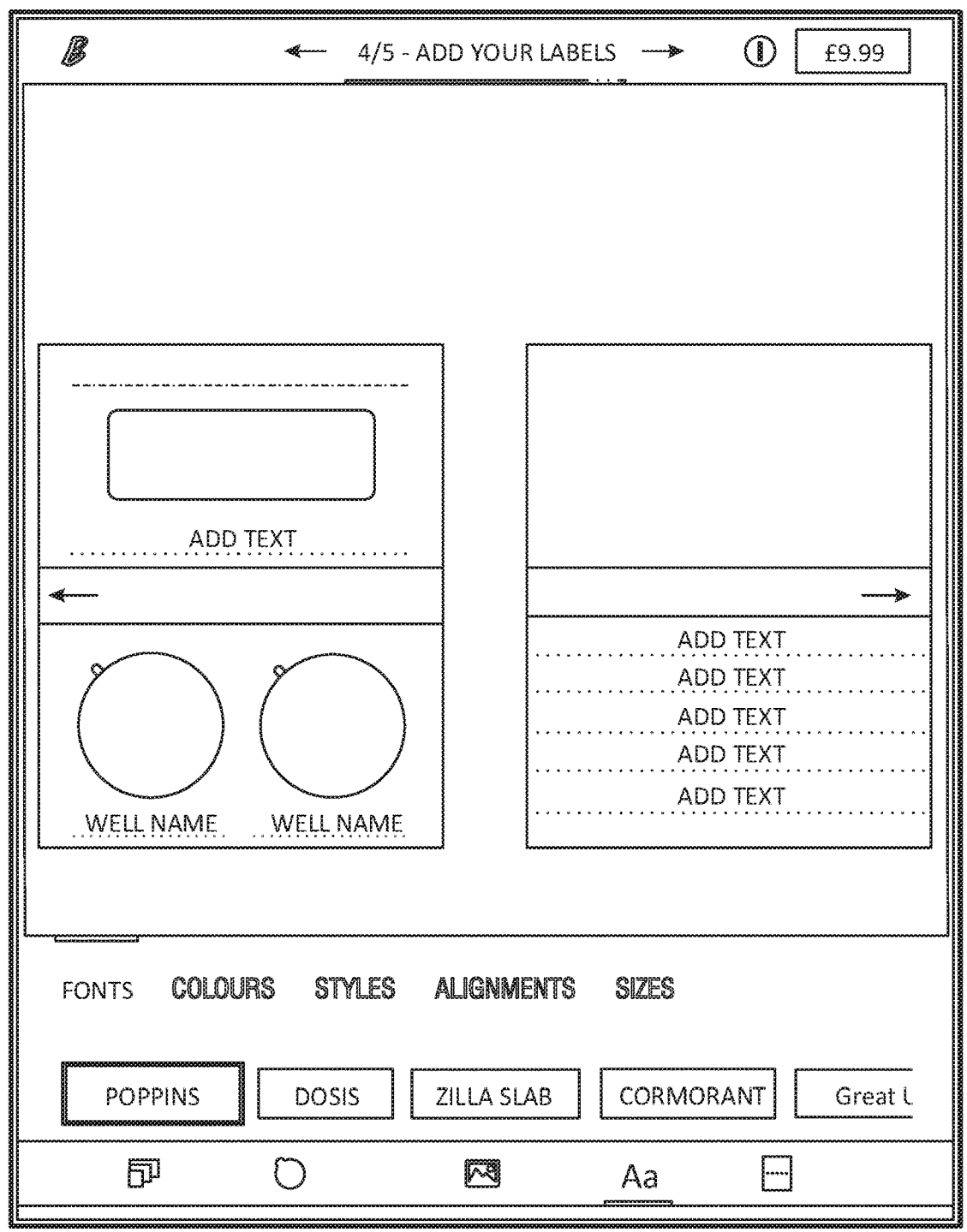
FIG. 12 illustrates an example of a text selection user interface for an influencer product customization engine, according to an embodiment.
Figure 13:
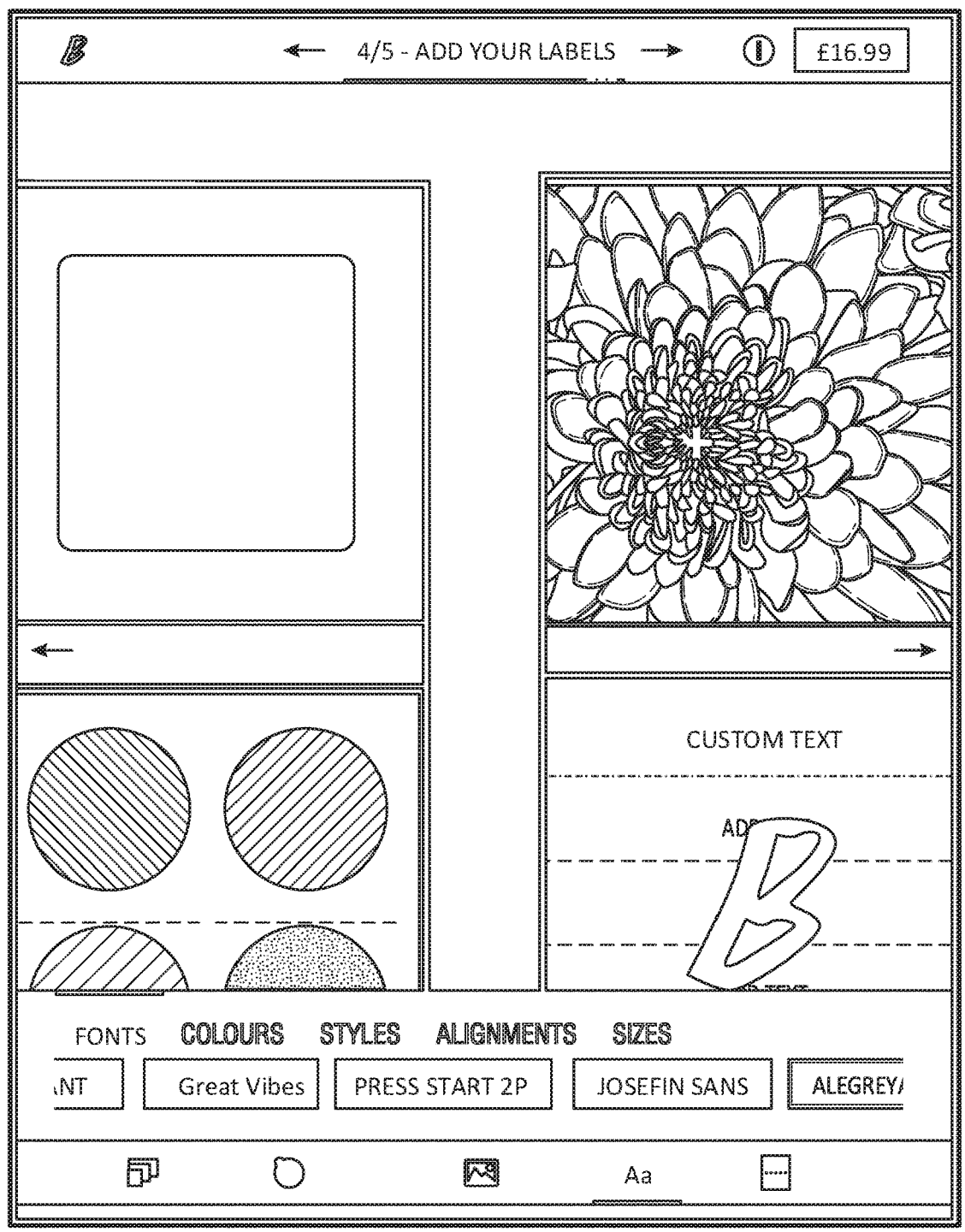
FIG. 13 illustrates an example of a text selection user interface with text sections made for an influencer product customization engine, according to an embodiment.
Figure 14:
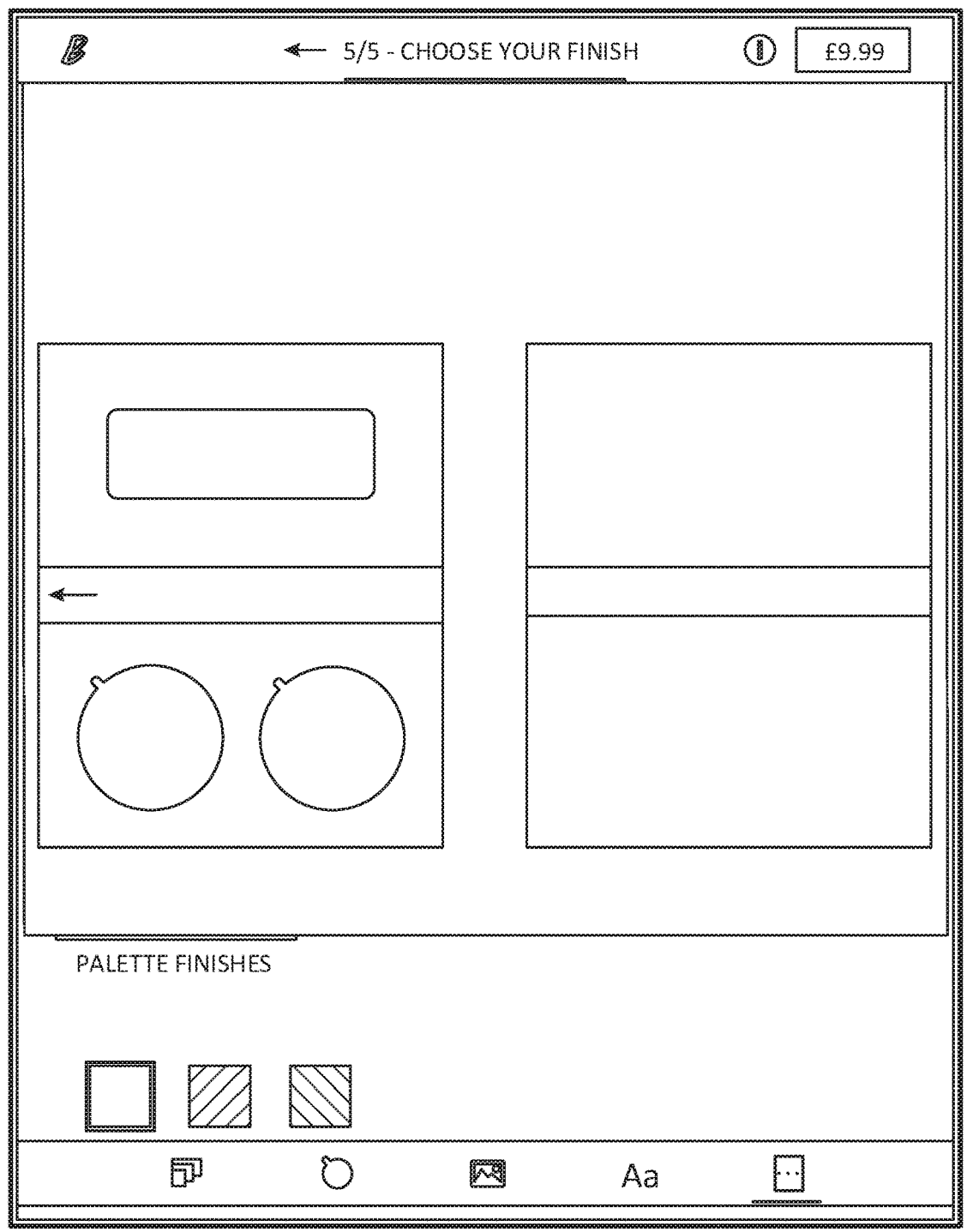
FIG. 14 illustrates an example of a palette finish selection user interface for an influencer product customization engine, according to an embodiment.
Figure 15:
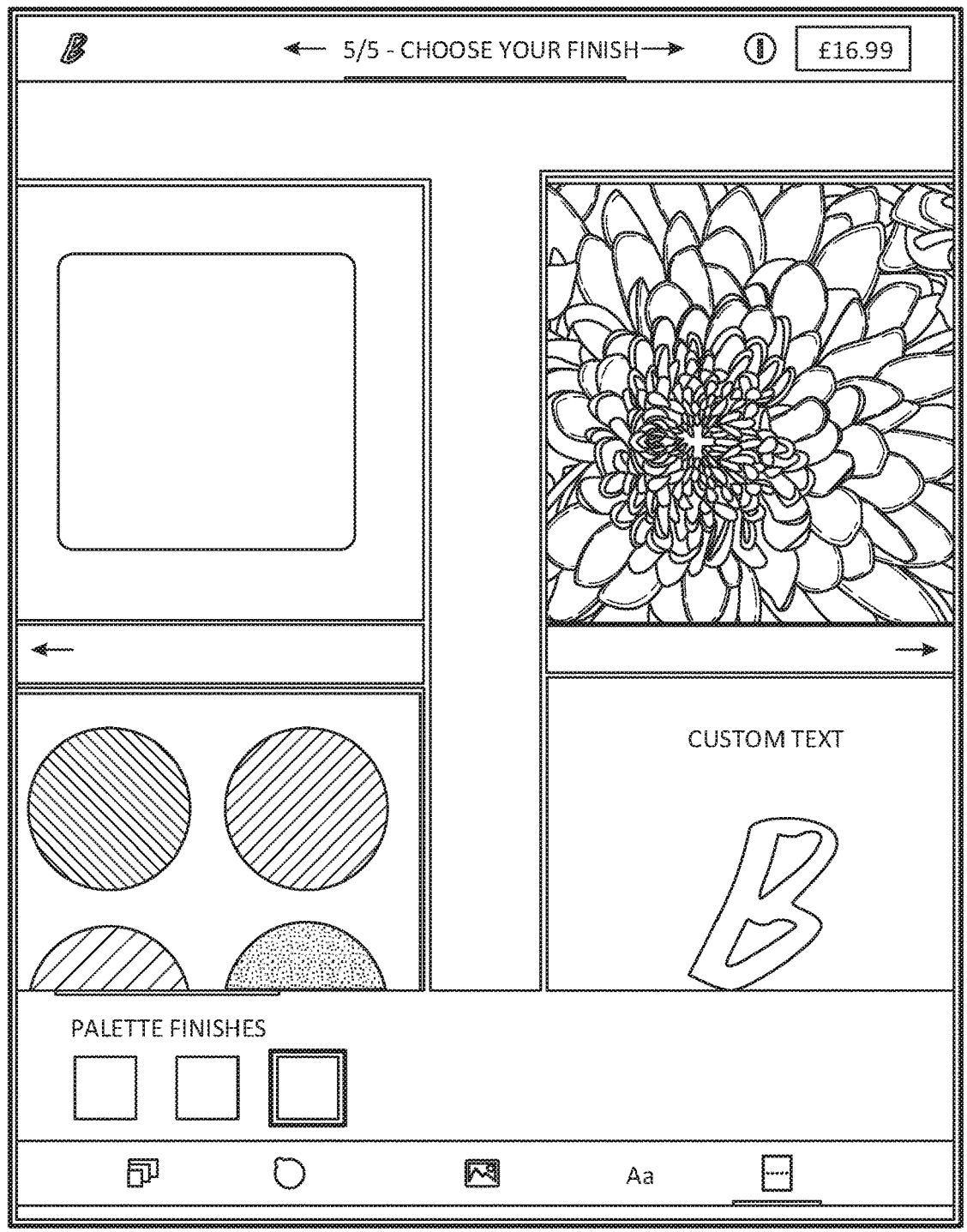
FIG. 15 illustrates an example of a palette finish selection user interface with a palette finish selected for an influencer product customization engine, according to an embodiment.

The palette size selector user interface may include navigational user interface elements that may guide the user through the process of configuring a product. For example, selectable user interface elements may be provided that represent each step of the product configuration process. For example, the selectable user interface elements may represent a product selection step (as shown in FIGS. 8 and 9), an image design selection step (e.g., as shown in FIGS. 10 and 11), a text selection step (e.g., as shown in FIGS. 12 and 13), and a palette finish selection step (e.g., as shown in FIGS. 14 and 15). The selectable user interface elements may be displayed in each step so that the user may quickly and efficiently navigate between steps if configuration changes are desired. The user interfaces may also include selectable navigational arrows that the user may select to move forward or backward through the product configuration process. A visual indicator may be provided in the vicinity (e.g., under, over, etc.) a selectable user interface element corresponding with a user interface currently displayed providing the user with an indication of what step in the process the user is currently completing.

FIG. 8 illustrates an example of a product selection user interface 800 for an influencer product customization engine, according to an embodiment. The product selection user interface 800 may include a sub-product selection area that includes a variety of sub-products that are compatible with the palette selected in FIG. 7. The products may be displayed based on an evaluation of sub-product attributes stored in a product configuration database or other data source. A variety of sub-product categories may be displayed as selectable user interface elements and when one of the selectable user interface elements is selected a set of selectable user interface elements associated with the category may be displayed. In an example, there may be more categories or sub-products than may be displayed in the user interface window. In such a case, the area displaying the selectable categories and/or sub-products becomes scrollable.

The palette elected in FIG. 7 may be displayed in a display area of the user interface along with an indication that an area of the product may be customizable. The user may select a customizable are of the product and then select a selectable user interface element corresponding to a sub-product to be added to the product. When an indication of a selection is received, the display of the palette may be updated in the display area to show the palette configuration including the sub-product in the customization area selected by the user.

FIG. 9 illustrates an example of a product selection user interface 900 with products selected for an influencer product customization engine, according to an embodiment. The in this instance has selected an upper left configurable area of the palette and has selected a blucher to be configured in the upper left of the palette. As the user makes additional selections and/or change selections, the configuration areas of the palette are dynamically updated to reflect the current selections. The user may then select a navigation user interface element to continue (or go back) in the product customization process.

FIG. 10 illustrates an example of an image design selection user interface 1000 for an influencer product customization engine, according to an embodiment. The image design selection user interface 1000 may include an image selection area that includes an interface for selecting an image (e.g., via drag and drop, browsing file locations, etc.). A variety of image selection categories may be displayed as selectable user interface elements and when one of the selectable user interface elements is selected configuration options (e.g., login credentials, paths, etc.) associated with the category may be displayed. The configuration options may be used by an API to establish a connection to a content provider (e.g., social media platform, etc.) from which content such as images may be obtained. After connection, the user may be able to select content to be placed in a configuration are of the product. In an example, the user may be able to select a color palette and may be able to select a color as a background color for the product. In an example, there may be more categories or content items than may be displayed in the user interface window. In such a case, the area displaying the selectable categories and/or sub-products becomes scrollable.

The palette elected in FIG. 7 may be displayed in a display area of the user interface along with an indication that an area of the product may be customizable with images or other selected content. The user may select a customizable are of the product and then select a selectable user interface element corresponding to content to be added to the product. When images are uploaded they are displayed as thumbnails in the image selection display are so that the user does not have to continually upload images for use in additional configuration areas. When an indication of a selection is received, the display of the palette may be updated in the display area to show the palette configuration including the content in the customization area selected by the user.

FIG. 11 illustrates an example of an image design selection user interface 1100 with selections made for an influencer product customization engine, according to an embodiment. The user may have selected a background color for the inside of the product (e.g., as shown in the upper left and lower left) and images for the cover and bottom of the product (e.g., as shown in the upper right and lower right). Upon each selection, the corresponding configuration area of the product is updated to reflect the selection. Thus, the user is provided with a what you see is what you get display of the product packaging so the user knows what the finished product will look like.

FIG. 12 illustrates an example of a text selection user interface 1200 for an influencer product customization engine, according to an embodiment. The text selection user interface 1200 may include a text selection area that includes an interface for selecting text configuration options. A variety of text configuration categories may be displayed as selectable user interface elements and when one of the selectable user interface elements is selected text configuration options associated with the category may be displayed. The configuration options may be used to format text to be entered into a text field of the product. In an example, the user may be able to select a color and font for the text. In an example, there may be more categories or content items than may be displayed in the user interface window. In such a case, the area displaying the selectable categories and/or sub-products becomes scrollable.

The palette elected in FIG. 7 may be displayed in a display area of the user interface along with an indication that an area of the product may be customizable with text. The user may select a customizable area of the product and then select one or more selectable user interface elements corresponding to text to be added to the product. When an indication of a selection is received, the user may select the text configuration options and may enter text to add to the configuration area. The display of the palette may be updated in the display area to show the palette configuration including the text entered in the customization area selected by the user.

FIG. 13 illustrates an example of a text selection user interface 1300 with text sections made for an influencer product customization engine, according to an embodiment. The user may have selected a font and color for the bottom of the product (e.g., as shown in the lower left of the product). Upon each selection of a text configuration option, the corresponding configuration area of the product is updated to reflect the selection (e.g., the text color, font, etc. is changed in real-time based on the selections). Thus, the user is provided with a what you see is what you get display of the product packaging so the user knows what the finished product will look like.

FIG. 14 illustrates an example of a palette finish selection user interface 1400 for an influencer product customization engine, according to an embodiment. The finish selection user interface 1400 may include a finish selection area that includes an interface for selecting a finish for the product (e.g., the color of the packaging substrate, etc.). A variety of finish options may be displayed as selectable user interface elements and when one of the selectable user interface elements is selected the display of the product may be updated to reflect the selected finish.

The palette elected in FIG. 7 may be displayed in a display area of the user interface. The user may select a finish for the product. When an indication of a selection is received, the display of the product may be updated in the display area to show the finish selected by the user.

FIG. 15 illustrates an example of a palette finish selection user interface 1500 with a palette finish selected for an influencer product customization engine, according to an embodiment. The user may have selected a finish for the product. Upon the selection of the finish, the corresponding area of the product (e.g., those areas not customized with content, etc.) is updated to reflect the selection. Thus, the user is provided with a what you see is what you get display of the product packaging so the user knows what the finished product will look like.

Figure 16:
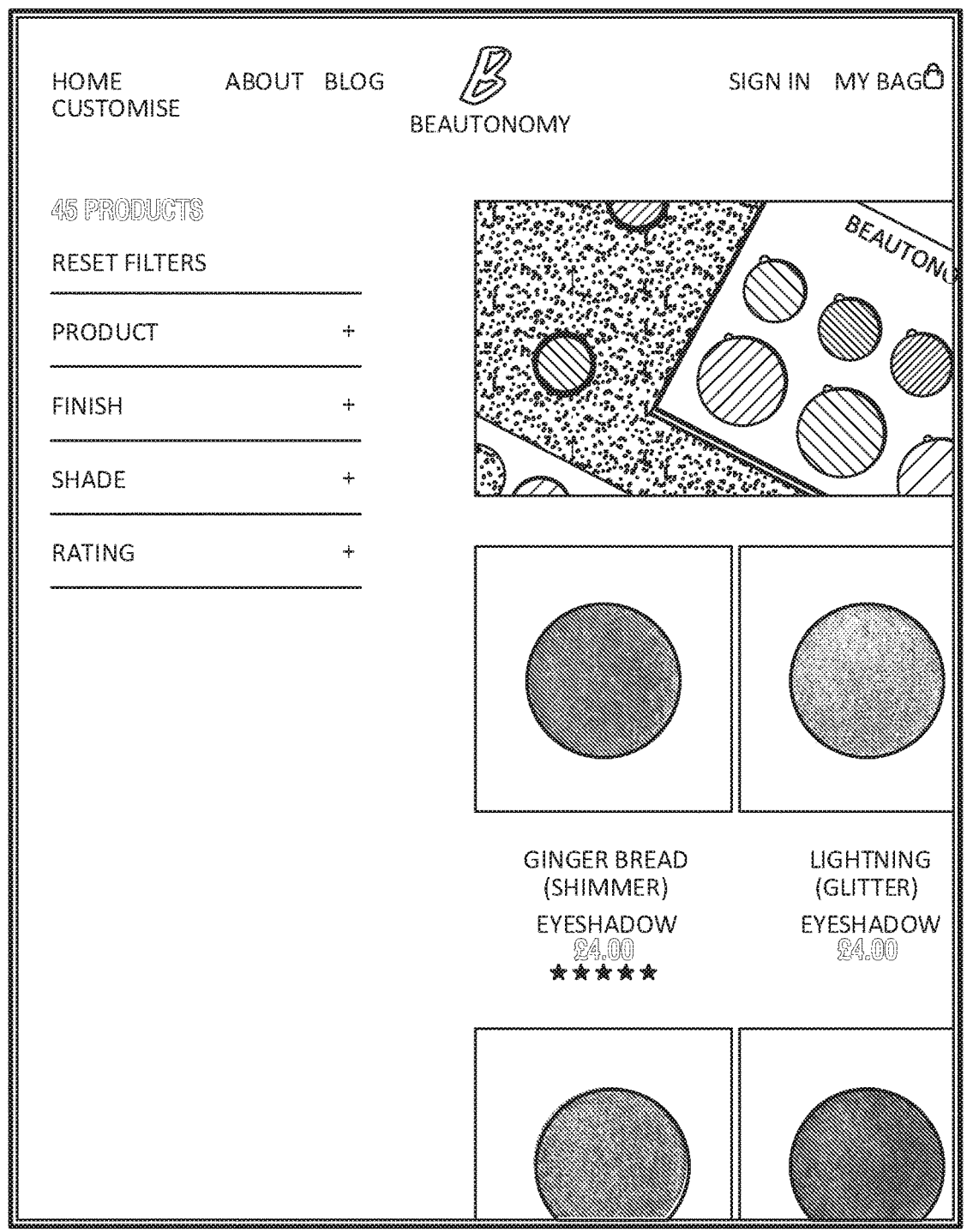
FIG. 16 illustrates an example of a product finder user interface for an influencer product customization engine, according to an embodiment.

FIG. 16 illustrates an example of a product finder user interface 1600 for an influencer product customization engine, according to an embodiment. The product finder user interface 1600 may include display of a variety of products for purchase. The product finder user interface 1600 may include a filter function including a set of customizable filters such as for example, product, finish, shade, rating, etc. The user may expand the filter options and may make filter selections. As filter selections are made, the display of the products may be updated to display products flowing through the filters. In an example, when a filter is selected, a database of product may be evaluated to determine products having attributes matching the selected filters. For example, a shade filter of red may result in the display of products having a red hue and a rating filter of four stars may return products that have an average rating of four stars or above. If both filters are selected, products having a red hue with an average rating of four start or above may be displayed. Selecting a product may place the product into a virtual shopping bag so that the user may purchase all of the selected products using a checkout function.

Figure 17:
FIG. 17 illustrates an example of a product template finder user interface for an influencer product customization engine, according to an embodiment.

FIG. 17 illustrates an example of a product template finder user interface 1700 for an influencer product customization engine, according to an embodiment. In an example, a user may wish to begin with a template as a starting point in the customization process. The template may provide a set of preconfigured areas of a product that the user may modify as desired using the user interfaces and processes described in FIGS. 7-16. If the user does not desire to modify the preconfigured design, the user may select the sub-products as described in FIGS. 8 and 9. The templates may provide a more efficient configuration process for users that are not comfortable creating a product design from scratch.

Figure 18:
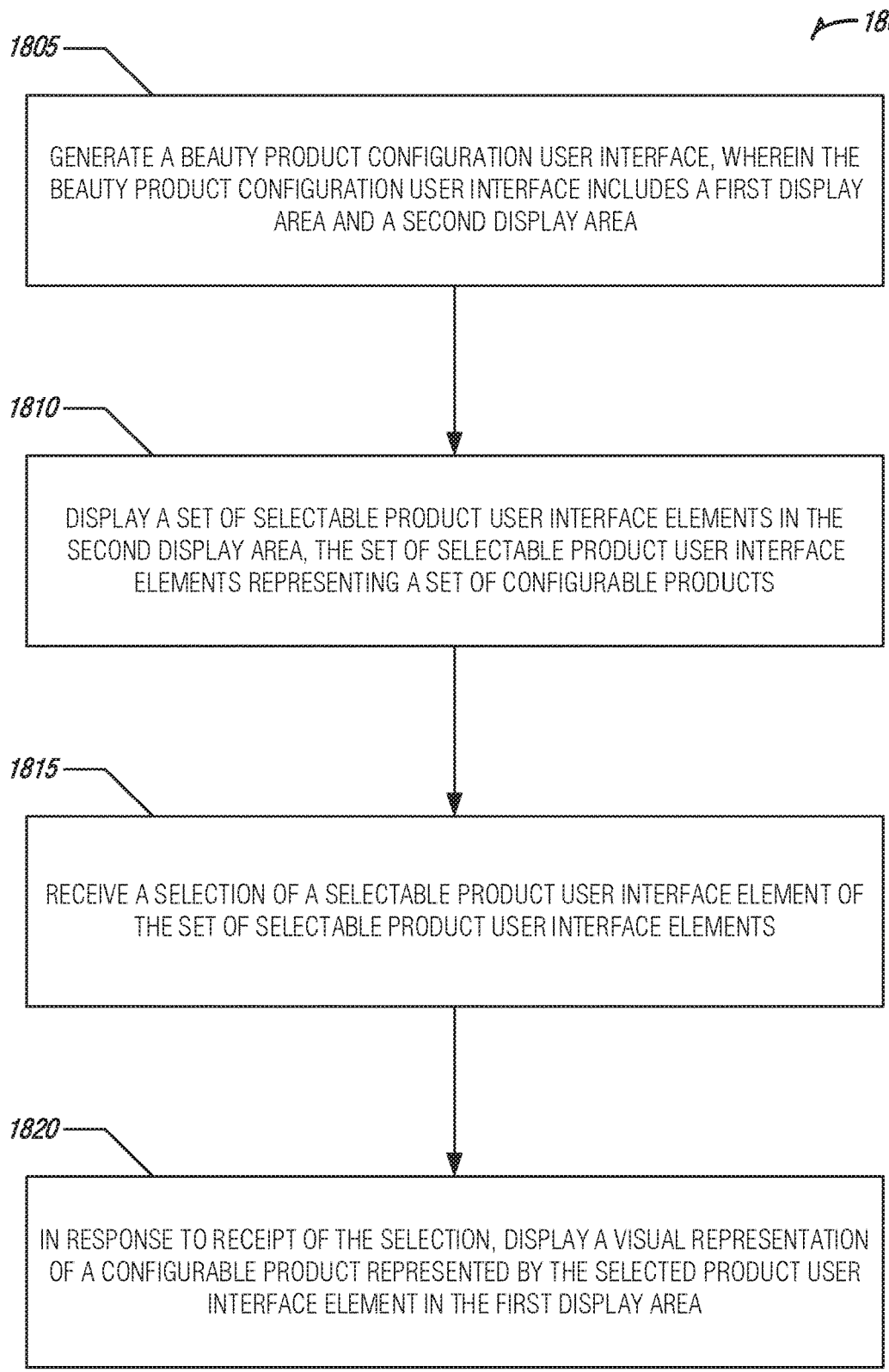
FIG. 18 is a flow diagram of an example method for a beauty product creation platform, according to an embodiment.

FIG. 18 is a flow diagram of an example method 1800 for a beauty product creation platform, according to an embodiment. The method 1800 may provide features as described in FIGS. 1-17.

A beauty product configuration user interface may be generated (e.g., at operation 1805). The beauty product configuration user interface may include a first display area and a second display area.

A set of selectable product user interface elements may be displayed in the second display area (e.g., at operation 1810). The set of selectable product user interface elements may represent a set of configurable products.

A selection may be received of a selectable product user interface element of the set of selectable product user interface elements (e.g., at operation 1815).

In response to receipt of the selection, a visual representation of a configurable product represented by the selected product user interface element may be displayed in the first display area (e.g., at operation 1820). In an example, the visual representation of the configurable product is a product template selected from a set of product templates based on the selection.

In an example, the visual representation of the configurable product may be configured with a plurality of product selection regions based on the selection. A set of user interface tools may be displayed in the second display area based on the plurality of product selection regions. A product selection region may be updated based on a user selection of the product selection region and a tool selection received from the user. In an example, the updating may be one of an update including displaying an image in the product selection region, an update including displaying text in the product selection region.

In another example, a navigation tool may be displayed in a third display area including selectable images corresponding to one or more configuration tools for the configurable product. A selection may be received of a selectable image of the selectable images. A set of product configuration tools may be displayed in the second display area based on the selection of the selectable image and the configurable product.

In another example, one or more pre-configured product configurations may be displayed corresponding to the configurable product. A selection may be received of a pre-configured product configuration from the one or more pre-configured product configurations. A set of product configuration tools may be pre-populated based on the pre-configured product configuration. A configuration change may be received from a product configuration tool of the set of product configuration tools. A display of the configured product may be updated based on the configuration change.

In an example, a configuration may be received of the configurable product. The configuration may be associated with a user profile of the user. The configuration may be added to the one or more pre-configured product configurations. The configuration may be displayed with an indication of the user profile with other pre-configured product configurations of the one or more pre-configured product configurations.

In yet another example, a configuration may be received of the configurable product. A set of component products may be identified that are associated with the configuration. A source may be identified for a component product of the set of component products. A production request may be transmitted to a producer for the component product. In an example, a production request may be generated for the configuration and the production request may be transmitted to a manufacturer.

In another example, a formulation may be determined for the component product. A set of formulation components may be identified for the formulation. A source may be identified for a formulation component of the set of formulation components and a request for the formulation component may be transmitted to the source of the formulation component. In an example, the set of formulation components may be received. Instructions may be generated for assembly of the component product using the formulation component based on the formulation and the instructions for assembling the component product may be transmitted to the producer.

In another example, instructions may be generated for assembling the configured product using the set of component products. Instructions may be generated for sending the configured product to the user. The instructions for assembling the configured product and the instructions for sending the configured product may be transmitted to the user to the producer.

Figure 19:
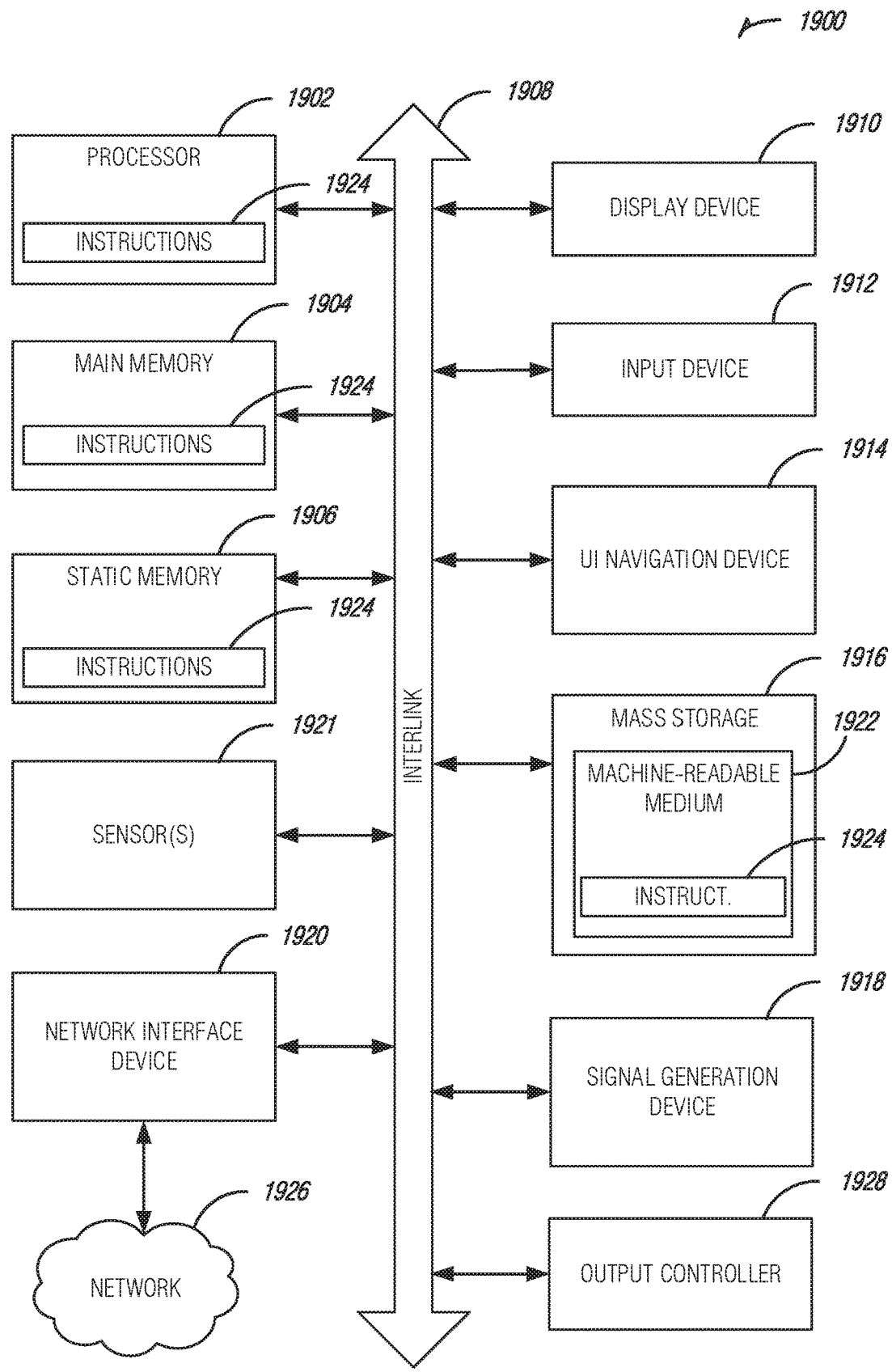
FIG. 19 is a block diagram illustrating an example of a machine upon which one or more embodiments may be implemented.

FIG. 19 illustrates a block diagram of an example machine 1900 upon which any one or more of the techniques (e.g., methodologies) discussed herein may perform. In alternative embodiments, the machine 1900 may operate as a standalone device or may be connected (e.g., networked) to other machines. In a networked deployment, the machine 1900 may operate in the capacity of a server machine, a client machine, or both in server-client network environments. In an example, the machine 1900 may act as a peer machine in peer-to-peer (P2P) (or other distributed) network environment. The machine 1900 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 1900 may include a hardware processor 1902 (e.g., a central processing unit (CPU), a graphics processing unit (GPU), a hardware processor core, or any combination thereof), a main memory 1904 and a static memory 1906, some or all of which may communicate with each other via an interlink (e.g., bus) 1908. The machine 1900 may further include a display unit 1910, an alphanumeric input device 1912 (e.g., a keyboard), and a user interface (UI) navigation device 1914 (e.g., a mouse). In an example, the display unit 1910, input device 1912 and UI navigation device 1914 may be a touch screen display. The machine 1900 may additionally include a storage device (e.g., drive unit) 1916, a signal generation device 1918 (e.g., a speaker), a network interface device 1920, and one or more sensors 1921, such as a global positioning system (GPS) sensor, compass, accelerometer, or other sensor. The machine 1900 may include an output controller 1928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1916 may include a machine readable medium 1922 on which is stored one or more sets of data structures or instructions 1924 (e.g., software) embodying or utilized by any one or more of the techniques or functions described herein. The instructions 1924 may also reside, completely or at least partially, within the main memory 1904, within static memory 1906, or within the hardware processor 1902 during execution thereof by the machine 1900. In an example, one or any combination of the hardware processor 1902, the main memory 1904, the static memory 1906, or the storage device 1916 may constitute machine readable media.

While the machine readable medium 1922 is illustrated as a single medium, the term "machine readable medium" may include a single medium or multiple media (e.g., a centralized or distributed database, and/or associated caches and servers) configured to store the one or more instructions 1924.

The term "machine readable medium" may include any medium that is capable of storing, encoding, or carrying instructions for execution by the machine 1900 and that cause the machine 1900 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1924 may further be transmitted or received over a communications network 1926 using a transmission medium via the network interface device 1920 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1920 may include one or more physical jacks (e.g., Ethernet, coaxial, or phone jacks) or one or more antennas to connect to the communications network 1926. In an example, the network interface device 1920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1900, and includes digital or analog communications signals or other intangible medium to facilitate communication of such software.

What is claimed is:

1. A system for generating a custom beauty product, the system comprising:
   at least one processor; and
   memory including instructions that, when executed by the at least one processor, cause the at least one processor to perform operations to:
   evaluate connection data of a social media platform to identify an influencer communicating on the social media platform, wherein the influencer is identified based on a number of subscribers to a communication channel of the social media platform associated with the influencer;
   obtain interest data from an influencer social media account of the social media platform, the influencer social media account associated with the influencer;
   select a set of product options using the interest data and a set of brand templates;

generate a beauty product configuration user interface, wherein the beauty product configuration user interface includes a first display area and a second display area;

display a set of selectable product user interface elements in the second display area, the set of selectable product user interface elements representing a set of configurable products corresponding to the set of product options;

receive a selection of a selectable product user interface element of the set of selectable product user interface elements;

in response to receipt of the selection, display a visual representation of a configurable product represented by the selected product user interface element in the first display area; and in response to receipt of an approval indication of the of the visual representation, transmit the visual representation via the communication channel.

2. The system of claim 1, wherein the visual representation of the configurable product is a product template selected from a set of product templates based on the selection.

3. The system of claim 1, further comprising instructions that cause the at least one processor to perform operations to:

configure the visual representation of the configurable product with a plurality of product selection regions based on the selection;

display a set of user interface tools in the second display area based on the plurality of product selection regions; and update a product selection region based on a user selection of the product selection region and a tool selection received from the user.

4. The system of claim 1, further comprising instructions that cause the at least one processor to perform operations to:

display, in a third display area, a navigation tool including selectable images corresponding to one or more configuration tools for the configurable product;

receive a selection of a selectable image of the selectable images; and display a set of product configuration tools in the second display area based on the selection of the selectable image and the configurable product.

5. The system of claim 1, further comprising instructions that cause the at least one processor to perform operations to:

display one or more pre-configured product configurations corresponding to the configurable product;

receive a selection of a pre-configured product configuration from the one or more pre-configured product configurations;

pre-populate a set of product configuration tools based on the pre-configured product configuration;

receive a configuration change from a product configuration tool of the set of product configuration tools; and update a display of the configured product based on the configuration change.

6. The system of claim 1, further comprising instructions that cause the at least one processor to perform operations to:

receive a configuration of the configurable product;

identify a set of component products associated with the configuration;

determine a source for a component product of the set of component products; and transmit a production request to a producer for the component product.

7. The system of claim 6, further comprising instructions that cause the at least one processor to perform operations to:

determine a formulation for the component product;

identify a set of formulation components for the formulation;

identify a source for a formulation component of the set of formulation components; and transmit a request for the formulation component to the source of the formulation component.

8. The system of claim 6, further comprising instructions that cause the at least one processor to perform operations to:

generate instructions for assembly of the configured product using the set of component products;

generate instructions to send the configured product to the user; and transmit the instructions for assembly of the configured product and the instructions to send the configured product to the user to the producer.

9. At least one non-transitory machine-readable medium with instructions for generating a custom beauty product that, when executed by at least one processor, cause the at least one processor to perform operations to:

evaluate connection data of a social media platform to identify an influencer communicating on the social media platform, wherein the influencer is identified based on a number of subscribers to a communication channel of the social media platform associated with the influencer;

obtain interest data from an influencer social media account of the social media platform, the influencer social media account associated with the influencer;

select a set of product options using the interest data and a set of brand templates;

generate a beauty product configuration user interface, wherein the beauty product configuration user interface includes a first display area and a second display area;

display a set of selectable product user interface elements in the second display area, the set of selectable product user interface elements representing a set of configurable products corresponding to the set of product options;

receive a selection of a selectable product user interface element of the set of selectable product user interface elements;

in response to receipt of the selection, display a visual representation of a configurable product represented by the selected product user interface element in the first display area; and in response to receipt of an approval indication of the of the visual representation, transmit the visual representation via the communication channel.

10. The at least one non-transitory machine-readable medium of claim 9, wherein the visual representation of the configurable product is a product template selected from a set of product templates based on the selection.

11. The at least one non-transitory machine-readable medium of claim 9, further comprising instructions that cause the at least one processor to perform operations to:

configure the visual representation of the configurable product with a plurality of product selection regions based on the selection;

display a set of user interface tools in the second display area based on the plurality of product selection regions; and update a product selection region based on a user selection of the product selection region and a tool selection received from the user.

12. The at least one non-transitory machine-readable medium of claim 9, further comprising instructions that cause the at least one processor to perform operations to:
display, in a third display area, a navigation tool including selectable images corresponding to one or more configuration tools for the configurable product;
receive a selection of a selectable image of the selectable images; and
display a set of product configuration tools in the second display area based on the selection of the selectable image and the configurable product.

13. The at least one non-transitory machine-readable medium of claim 9, further comprising instructions that cause the at least one processor to perform operations to:
display one or more pre-configured product configurations corresponding to the configurable product;
receive a selection of a pre-configured product configuration from the one or more pre-configured product configurations;
pre-populate a set of product configuration tools based on the pre-configured product configuration;
receive a configuration change from a product configuration tool of the set of product configuration tools; and
update a display of the configured product based on the configuration change.

14. The at least one non-transitory machine-readable medium of claim 9, further comprising instructions that cause the at least one processor to perform operations to:
receive a configuration of the configurable product; identify a set of component products associated with the configuration; determine a source for a component product of the set of component products; and transmit a production request to a producer for the component product.

15. A method for generating a custom beauty product, the method comprising:
evaluating connection data of a social media platform to identify an influencer communicating on the social media platform, wherein the influencer is identified based on a number of subscribers to a communication channel of the social media platform associated with the influencer;
obtaining interest data from an influencer social media account of the social media platform, the influencer social media account associated with the influencer;
selecting a set of product options using the interest data and a set of brand templates;
generating a beauty product configuration user interface, wherein the beauty product configuration user interface includes a first display area and a second display area;
displaying a set of selectable product user interface elements in the second display area, the set of selectable product user interface elements representing a set of configurable products corresponding to the set of product options;
receiving a selection of a selectable product user interface element of the set of selectable product user interface elements;
in response to receiving the selection, displaying a visual representation of a configurable product represented by the selected product user interface element in the first display area; and
in response to receipt of an approval indication of the of the visual representation, transmitting the visual representation via the communication channel.

16. The method of claim 15, wherein the visual representation of the configurable product is a product template selected from a set of product templates based on the selection.

17. The method of claim 15, further comprising:
configuring the visual representation of the configurable product with a plurality of product selection regions based on the selection;
displaying a set of user interface tools in the second display area based on the plurality of product selection regions; and
updating a product selection region based on a user selection of the product selection region and a tool selection received from the user.

18. The method of claim 15, further comprising:
displaying, in a third display area, a navigation tool including selectable images corresponding to one or more configuration tools for the configurable product;
receiving a selection of a selectable image of the selectable images; and
displaying a set of product configuration tools in the second display area based on the selection of the selectable image and the configurable product.

19. The method of claim 15, further comprising:
displaying one or more pre-configured product configurations corresponding to the configurable product;
receiving a selection of a pre-configured product configuration from the one or more pre-configured product configurations;
pre-populating a set of product configuration tools based on the pre-configured product configuration;
receiving a configuration change from a product configuration tool of the set of product configuration tools; and
updating a display of the configured product based on the configuration change.

20. The method of claim 15, further comprising:
receiving a configuration of the configurable product;
identifying a set of component products associated with the configuration;
determining a source for a component product of the set of component products; and
transmitting a production request to a producer for the component product.

* * * * *